(12) United States Patent
Kim et al.

(10) Patent No.: US 12,288,797 B2
(45) Date of Patent: Apr. 29, 2025

(54) IMAGE SENSOR

(71) Applicant: SAMSUNG ELECTRONICS CO., LTD., Suwon-si (KR)

(72) Inventors: Junghyun Kim, Suwon-si (KR); Bumsuk Kim, Hwaseong-si (KR); Jonghoon Park, Seoul (KR); Hyungeun Yoo, Suwon-si (KR); Yun Ki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 17/710,249

(22) Filed: Mar. 31, 2022

(65) Prior Publication Data
US 2023/0036152 A1 Feb. 2, 2023

(30) Foreign Application Priority Data

Jul. 27, 2021 (KR) .................. 10-2021-0098676

(51) Int. Cl.
*H01L 27/146* (2006.01)
*H04N 25/702* (2023.01)

(52) U.S. Cl.
CPC .... *H01L 27/1463* (2013.01); *H01L 27/14621* (2013.01); *H01L 27/14627* (2013.01); *H01L 27/1464* (2013.01); *H01L 27/14645* (2013.01); *H01L 27/14689* (2013.01); *H04N 25/702* (2023.01)

(58) Field of Classification Search
CPC .................................................. H01L 27/1463
See application file for complete search history.

(56) References Cited

U.S. PATENT DOCUMENTS

| 8,629,020 | B2 | 1/2014 | Kim et al. |
| 9,025,063 | B2 | 5/2015 | Ahn et al. |
| 9,240,345 | B2 | 1/2016 | Sung |
| 9,406,710 | B2 | 8/2016 | Kao |
| 9,768,220 | B2 * | 9/2017 | Tseng ............... H01L 27/14616 |
| 10,825,853 | B2 | 11/2020 | Chiang et al. |

(Continued)

FOREIGN PATENT DOCUMENTS

| KR | 10-2011-0077409 A | 7/2011 |
| KR | 10-1967835 B1 | 4/2019 |

*Primary Examiner* — Evren Seven
*Assistant Examiner* — Cole Leon Lindsey
(74) *Attorney, Agent, or Firm* — Sughrue Mion, PLLC

(57) ABSTRACT

An image sensor includes a substrate including pixel regions and having a first surface, a second surface opposite the first surface, and a first trench recessed from the first surface, a shallow device isolation pattern provided in the first trench, and a deep device isolation pattern between the pixel regions and provided in the substrate. The deep device isolation pattern includes a semiconductor pattern penetrating at least a portion of the substrate, and an isolation pattern provided between the substrate and the semiconductor pattern. The isolation pattern includes a first isolation pattern adjacent to the second surface, and a second isolation pattern adjacent to the first surface. A first interface at which the first isolation pattern contacts the second isolation pattern is spaced apart from the shallow device isolation pattern. The first isolation pattern includes a different material from that of the second isolation pattern.

19 Claims, 23 Drawing Sheets

(56) References Cited

U.S. PATENT DOCUMENTS

| | | | |
|---|---|---|---|
| 2013/0307040 A1* | 11/2013 | Ahn | H01L 27/1463 |
| | | | 257/292 |
| 2015/0372031 A1 | 12/2015 | Yoon, et al. | |
| 2016/0204142 A1* | 7/2016 | Um | H01L 27/1464 |
| | | | 257/446 |
| 2019/0252425 A1 | 8/2019 | Ogawa | |
| 2020/0219911 A1 | 7/2020 | Hur et al. | |
| 2021/0193702 A1 | 6/2021 | Zang et al. | |

* cited by examiner

IMAGE SENSOR

CROSS-REFERENCE TO RELATED APPLICATION(S)

This application claims priority under 35 U.S.C. § 119 to Korean Patent Application No. 10-2021-0098676, filed on Jul. 27, 2021, in the Korean Intellectual Property Office, the disclosure of which is incorporated by reference herein in its entirety.

BACKGROUND

The present disclosure relates to an image sensor, and more particularly, to a CMOS image sensor.

An image sensor is a semiconductor device for converting an optical image into electrical signals. As computer and communication industries have been developed, high-performance image sensors have been increasingly demanded in various fields such as a digital camera, a camcorder, a personal communication system (PCS), a game console, a security camera, and a medical micro camera. Image sensors may be categorized as any one of charge coupled device (CCD) image sensors and complementary metal-oxide-semiconductor (CMOS) image sensors. CIS is short for the CMOS image sensor. The CIS may include a plurality of pixels arranged two-dimensionally. Each of the pixels may include a photodiode (PD). The photodiode may convert incident light into an electrical signal. The plurality of pixels may be defined by a deep device isolation pattern disposed therebetween.

SUMMARY

Embodiments may provide an image sensor capable of preventing a cross-talk phenomenon and of minimizing noise, and a method of manufacturing the same.

According to an aspect of an example embodiment, an image sensor includes: a substrate including a plurality of pixel regions, the substrate having a first surface, a second surface opposite the first surface, and a first trench recessed from the first surface; a shallow device isolation pattern provided in the first trench; and a deep device isolation pattern provided in the substrate between pixel regions of the plurality of pixel regions. The deep device isolation pattern includes a semiconductor pattern penetrating at least a portion of the substrate, and an isolation pattern provided between the substrate and the semiconductor pattern. The isolation pattern includes a first isolation pattern adjacent to the second surface of the substrate, and a second isolation pattern adjacent to the first surface of the substrate. A first interface at which the first isolation pattern contacts the second isolation pattern is spaced apart from the shallow device isolation pattern. The first isolation pattern includes a first material, and the second isolation pattern includes a second material that is different from the first material.

According to an aspect of an example embodiment, an image sensor includes: a substrate including a plurality of pixel regions, the substrate having a first surface, a second surface opposite the first surface, and a first trench recessed from the first surface; a shallow device isolation pattern provided in the first trench; and a deep device isolation pattern provided in the substrate between pixel regions of the plurality of pixel regions. The deep device isolation pattern includes a semiconductor pattern penetrating at least a portion of the substrate, and an isolation pattern provided between the substrate and the semiconductor pattern. The isolation pattern includes a first isolation pattern adjacent to the second surface of the substrate, and a second isolation pattern adjacent to the first surface of the substrate. The second isolation pattern includes a lower portion provided under the shallow device isolation pattern, and an upper portion penetrating the shallow device isolation pattern. The lower portion of the second isolation pattern is aligned with the first isolation pattern. The first isolation pattern includes a first material, and the second isolation pattern includes a second material that is different from the first material.

According to an aspect of an example embodiment, an image sensor includes: a substrate including a plurality of pixel regions, the substrate having a first surface, a second surface opposite, and a first trench recessed from the first surface; a shallow device isolation pattern provided in the first trench; a deep device isolation pattern provided between pixel regions of the plurality of pixel regions and disposed in the substrate; a transistor provided on the first surface of the substrate; micro lenses provided on the second surface of the substrate; and color filters provided on the plurality of pixel regions and between the substrate and the micro lenses. The deep device isolation pattern includes a semiconductor pattern penetrating at least a portion of the substrate, and an isolation pattern provided between the substrate and the semiconductor pattern. The isolation pattern includes a first isolation pattern adjacent to the second surface of the substrate, and a second isolation pattern adjacent to the first surface of the substrate. The first isolation pattern includes a first insulating material and the second isolation pattern includes a second insulating material that is different from the first insulating material.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Example embodiments of the disclosure will now be described more fully with reference to the accompanying drawings.

Figure 1:
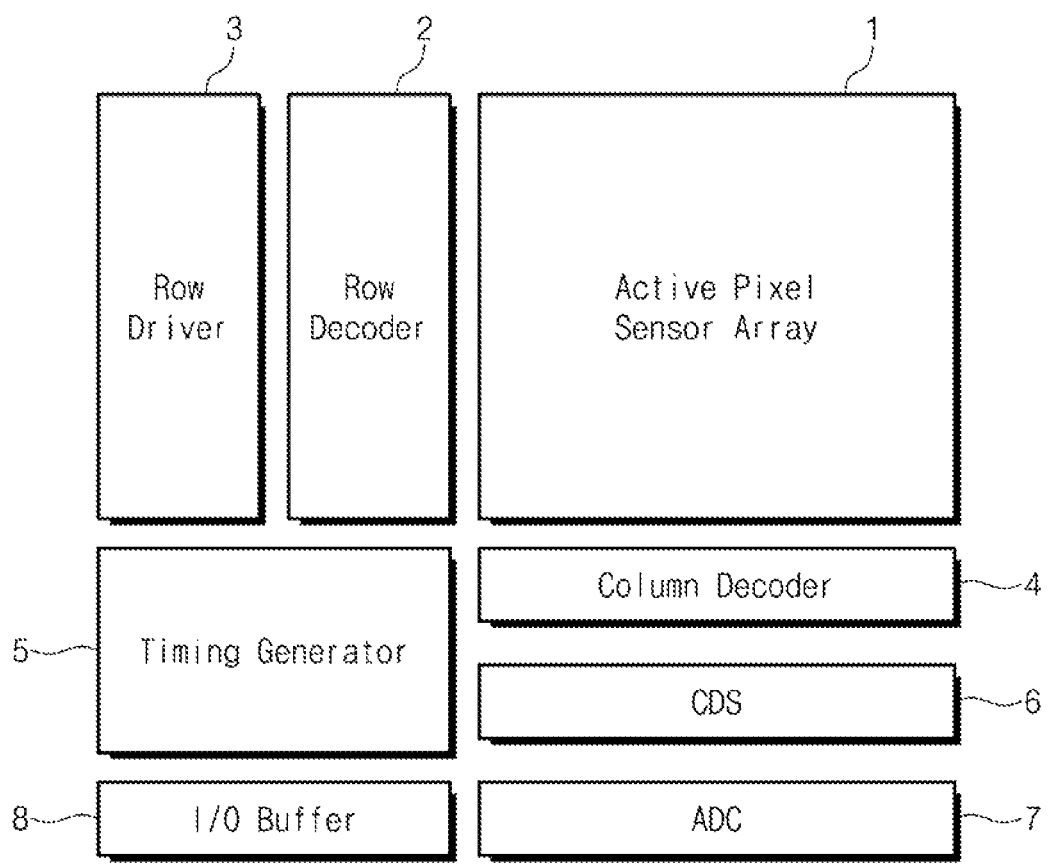
FIG. 1 is a block diagram schematically illustrating an image sensor according to an example embodiment.

FIG. 1 is a block diagram schematically illustrating an image sensor according to an example embodiment.

Referring to FIG. 1 an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of pixels arranged two-dimensionally and may convert optical signals into electrical signals. The active pixel sensor array 1 may be driven by a plurality of driving signals (e.g., a pixel selection signal, a reset signal, and a charge transfer signal) provided from the row driver 3. In addition, the electrical signals converted by the active pixel sensor array 1 may be provided to the correlated double sampler 6.

The row driver 3 may provide the plurality of driving signals for driving the plurality of pixels to the active pixel sensor array 1 in response to signals decoded in the row decoder 2. When the pixels are arranged in a matrix form, the driving signals may be provided by rows of the matrix form.

The timing generator 5 may provide timing signals and control signals to the row decoder 2 and the column decoder 4.

The correlated double sampler (CDS) 6 may receive electrical signals generated from the active pixel sensor array 1 and may hold and sample the received electrical signals. The correlated double sampler 6 may doubly sample a specific noise level and a signal level of the electrical signal and may output a difference level corresponding to a difference between the noise level and the signal level.

The analog-to-digital converter (ADC) 7 may convert an analog signal, which corresponds to the difference level outputted from the correlated double sampler 6, into a digital signal and may output the digital signal.

The I/O buffer 8 may latch the digital signals and may sequentially output the latched signals to an image signal processing unit in response to signals decoded in the column decoder 4.

Figure 2:
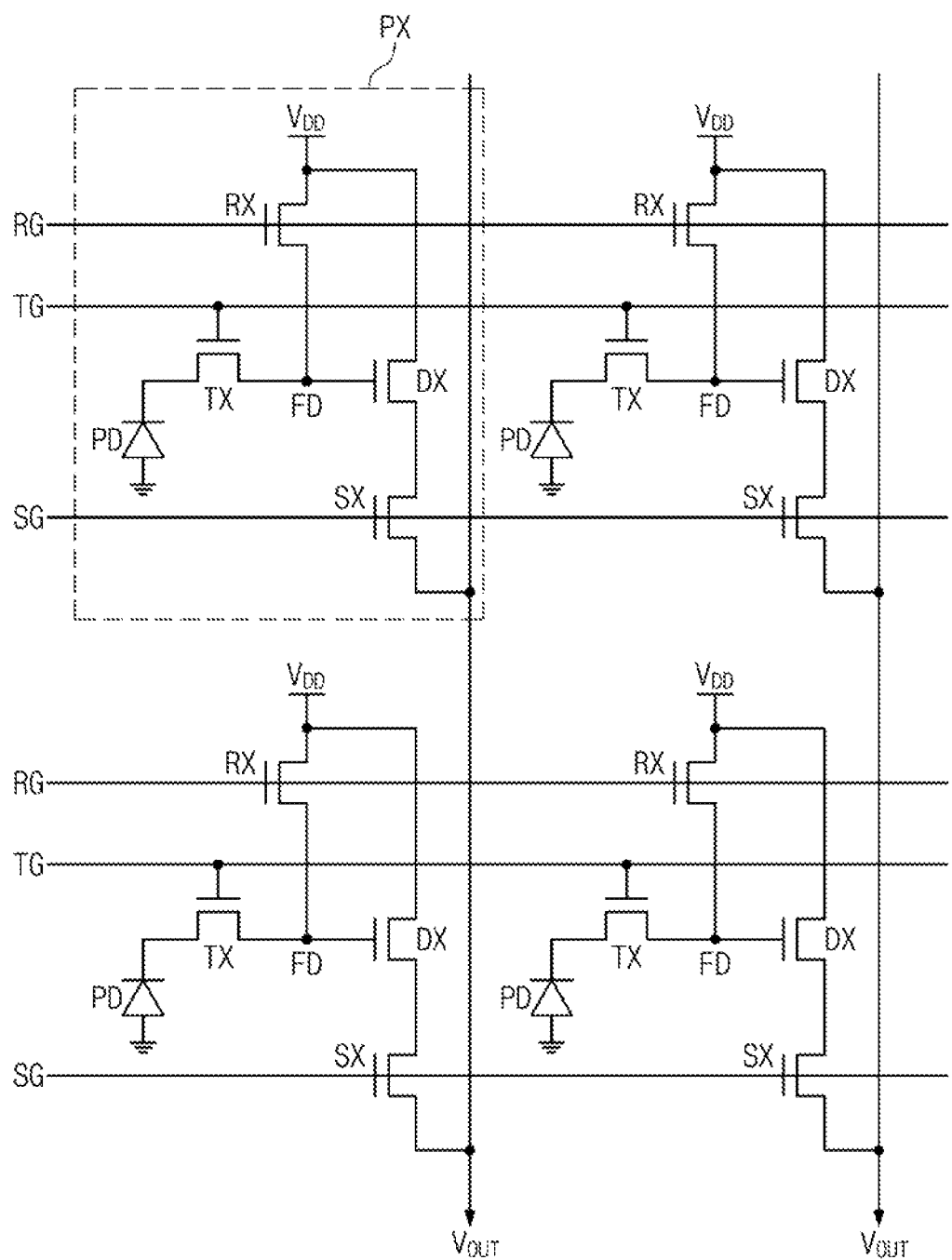
FIG. 2 is a circuit diagram illustrating an active pixel sensor array of an image sensor according to an example embodiment.

FIG. 2 is a circuit diagram illustrating an active pixel sensor array of an image sensor according to an example embodiment.

Referring to FIGS. 1 and 2, the active pixel sensor array 1 may include a plurality of pixel regions PX, and the pixel regions PX may be arranged in a matrix form. Each of the pixel regions PX may include a transfer transistor TX and logic transistors RX, SX and DX. The logic transistors may include a reset transistor RX, a selection transistor SX, and a drive transistor DX. The transfer transistor TX, the reset transistor RX and the selection transistor SX may include a transfer gate TG, a reset gate RG and a selection gate SG, respectively. Each of the pixel regions PX may further include a photoelectric conversion element PD and a floating diffusion region FD.

The photoelectric conversion element PD may generate and accumulate photocharges in proportion to the amount of light incident from the outside. The photoelectric conversion element PD may be a photodiode including a P-type dopant region and an N-type dopant region. The transfer transistor TX may transfer photocharges (or charges) generated from the photoelectric conversion element PD to the floating diffusion region FD. The floating diffusion region FD may receive the charges generated from the photoelectric conversion element PD and may cumulatively store the received charges. The drive transistor DX may be controlled according to the amount of the charges accumulated in the floating diffusion region FD.

The reset transistor RX may periodically reset the charges accumulated in the floating diffusion region FD. A drain electrode of the reset transistor RX may be connected to the floating diffusion region FD, and a source electrode of the reset transistor RX may be connected to a power voltage $V_{DD}$. When the reset transistor RX is turned-on, the power voltage $V_{DD}$ connected to the source electrode of the reset transistor RX may be applied to the floating diffusion region FD. Thus, when the reset transistor RX is turned-on, the charges accumulated in the floating diffusion region FD may be discharged to reset the floating diffusion region FD.

The drive transistor DX may function as a source follower buffer amplifier. The drive transistor DX may amplify a potential change in the floating diffusion region FD and may output the amplified potential change to an output line $V_{OUT}$.

The selection transistor SX may select pixel regions PX to be read in the unit of row. When the selection transistor SX is turned-on, the power voltage $V_{DD}$ may be applied to a drain electrode of the drive transistor DX.

The unit pixel region PX including a single photoelectric conversion element PD and four transistors TX, RX, DX and SX is illustrated as an example in FIG. 2, but embodiments are not limited thereto. In certain embodiments, the reset transistor RX, the drive transistor DX and/or the selection transistor SX may be shared by adjacent pixel regions PX. Thus, an integration density of the image sensor may be improved.

Figure 3:
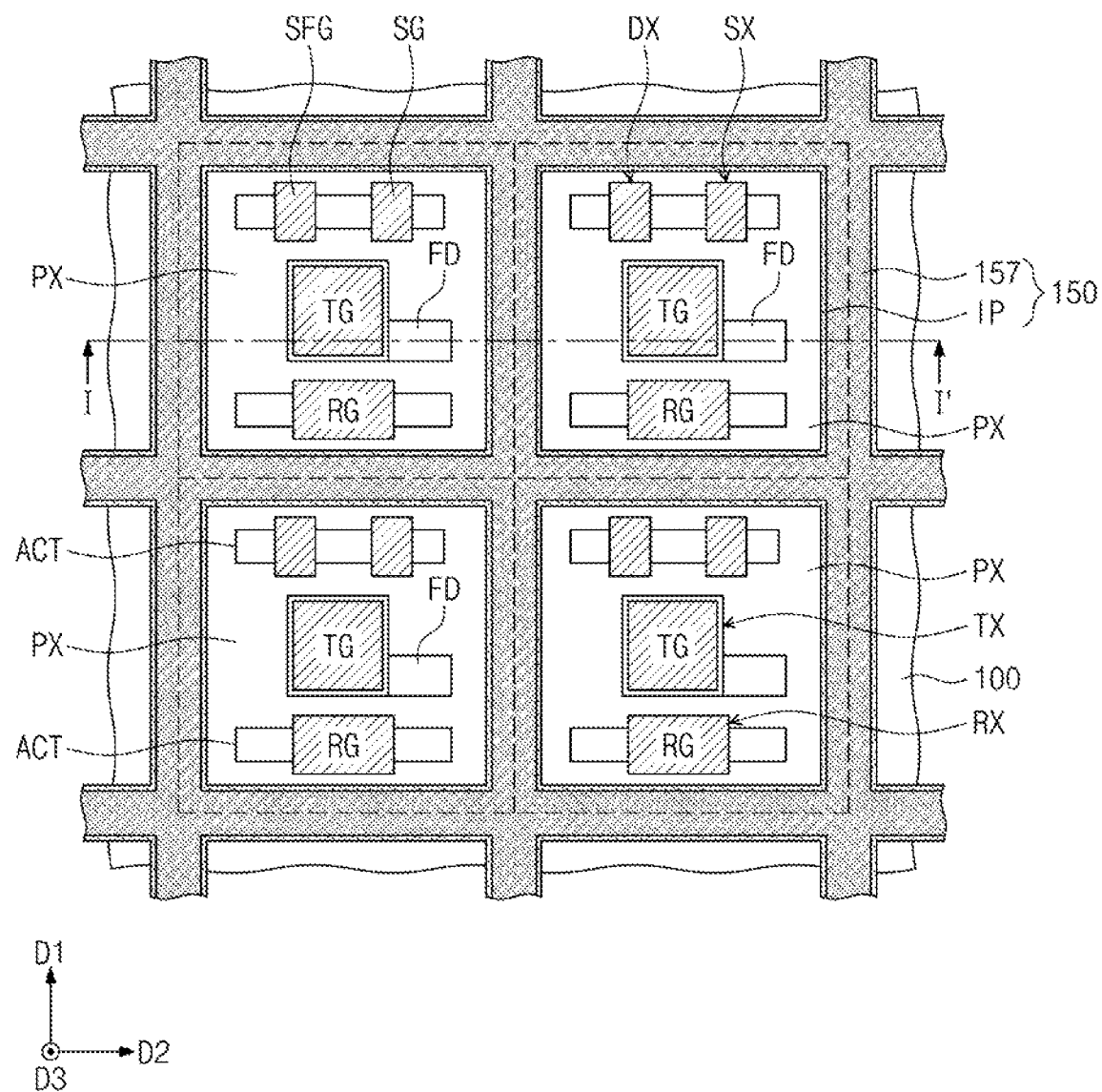
FIG. 3 is a plan view illustrating an image sensor according to an example embodiment.
Figure 4:
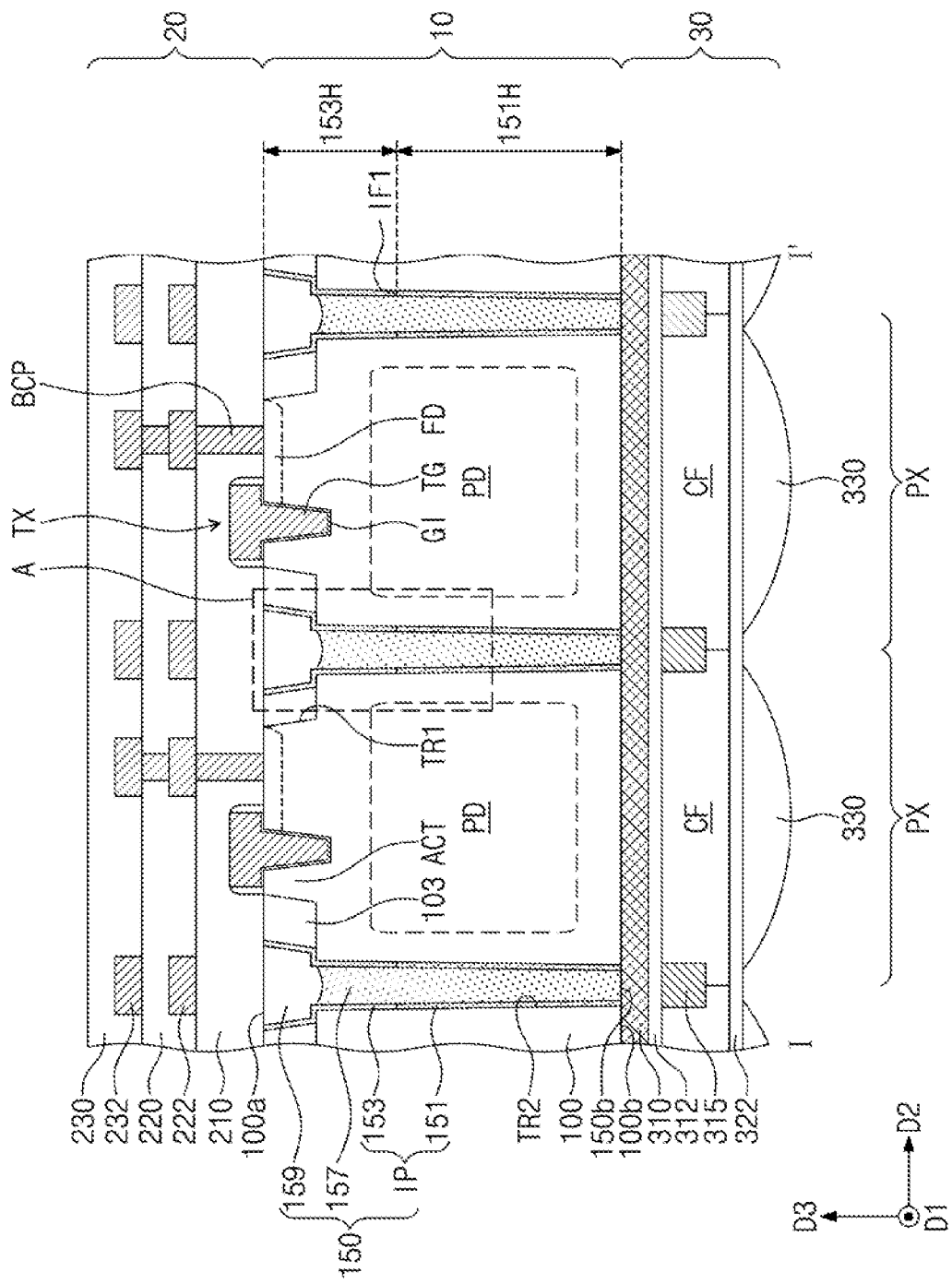
FIG. 4 is a cross-sectional view taken along a line I-I' of FIG. 3 to illustrate an image sensor according to an example embodiment.
Figure 5:
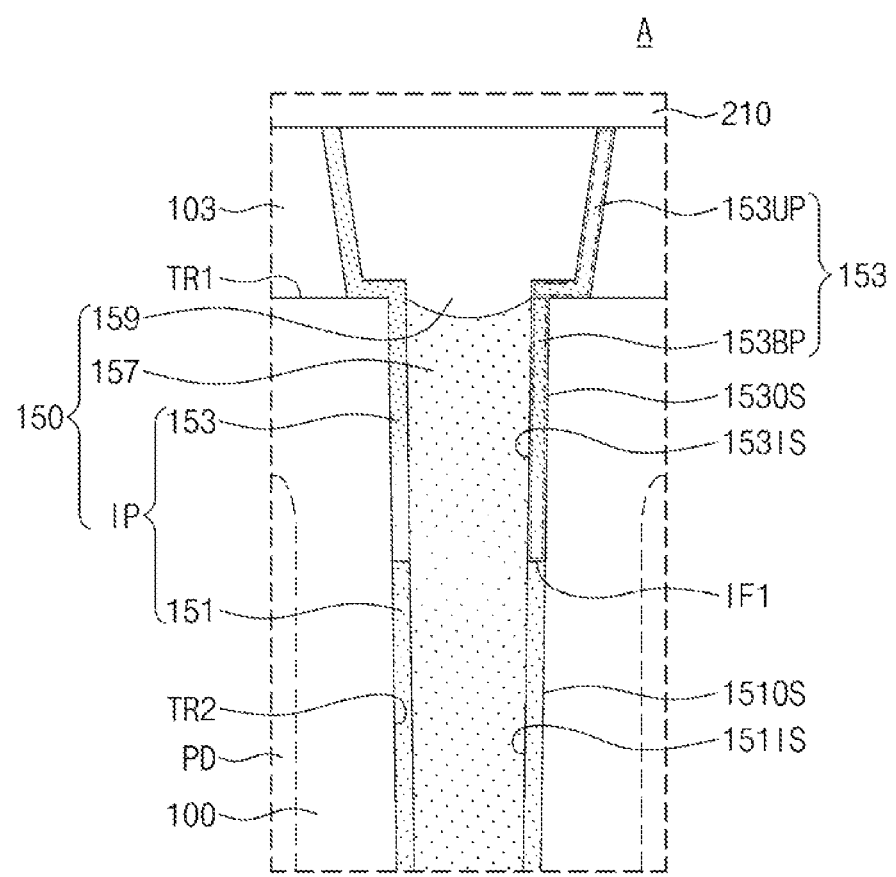
FIG. 5 is an enlarged view of a portion 'A' of FIG. 4.

FIG. 3 is a plan view illustrating an image sensor according to an example embodiment. FIG. 4 is a cross-sectional view taken along a line I-I' of FIG. 3 to illustrate an image sensor according to an example embodiment. FIG. 5 is an enlarged view of a portion 'A' of FIG. 4.

Referring to FIGS. 3 and 4, an image sensor may include a photoelectric conversion layer 10, an interconnection layer 20, and a light transmitting layer 30. The photoelectric conversion layer 10 may be disposed between the interconnection layer 20 and the light transmitting layer 30.

The photoelectric conversion layer 10 may include a substrate 100. The substrate 100 may be a semiconductor substrate (e.g., a silicon substrate, a germanium substrate, a silicon-germanium substrate, a group II-VI compound semiconductor substrate, or a group III-V compound semiconductor substrate) or a silicon-on-insulator (SOI) substrate. The substrate 100 may have a first surface 100a and a second surface 100b, which are opposite to each other. For example, the first surface 100a of the substrate 100 may be a front surface, and the second surface 100b of the substrate 100 may be a back surface. Light may be incident to the second surface 100b of the substrate 100.

The substrate 100 may include a plurality of pixel regions PX. The plurality of pixel regions PX may be two-dimensionally arranged in a first direction D1 and a second direction D2 which are parallel to the second surface 100b of the substrate 100, when viewed in a plan view as shown, e.g., in FIG. 3. The first direction D1 and the second direction D2 may intersect each other. The substrate 100 may include a plurality of photoelectric conversion regions PD therein. The photoelectric conversion regions PD may be located between the first surface 100a and the second surface 100b of the substrate 100. The photoelectric conversion regions PD may be provided in the pixel regions PX of the substrate 100, respectively. The photoelectric conversion region PD may mean a region in which the photoelectric conversion element PD of FIG. 2 is disposed.

The substrate 100 may have a first conductivity type, and the photoelectric conversion region PD may be a region doped with dopants having a second conductivity type different from the first conductivity type. For example, the first conductivity type may be a P-type, and the second conductivity type may be an N-type. Dopants having the first conductivity type may include at least one of, for example, aluminum, boron, indium, or gallium. The dopants having the second conductivity type may include at least one of, for example, phosphorus, arsenic, bismuth, or antimony. The photoelectric conversion region PD may form a PN junction with the substrate 100 to form a photodiode.

The photoelectric conversion layer 10 may include a shallow device isolation pattern 103. The shallow device isolation pattern 103 may be disposed adjacent to the first surface 100a of the substrate 100. Each of the plurality of pixel regions PX may include active regions ACT defined by the shallow device isolation pattern 103. The shallow device isolation pattern 103 may be disposed in a first trench TR1 recessed from the first surface 100a of the substrate 100. The shallow device isolation pattern 103 may include at least one of, for example, silicon oxide, silicon nitride, or silicon oxynitride.

The photoelectric conversion layer 10 may include a deep device isolation pattern 150. The deep device isolation pattern 150 may be disposed in the substrate 100 between the plurality of pixel regions PX. The deep device isolation pattern 150 may penetrate at least a portion of the substrate 100. The deep device isolation pattern 150 may penetrate the shallow device isolation pattern 103 and may extend into the substrate 100. The deep device isolation pattern 150 may be disposed in a second trench TR2. The second trench TR2 may penetrate the shallow device isolation pattern 103 and may extend toward the second surface 100b of the substrate 100. A width of an upper portion of the second trench TR2 may be less than a width of a bottom surface of the first trench TR1. The term 'width' may mean a distance measured in a direction parallel to the second surface 100b of the substrate 100, for example, a distance measured in the second direction D2. The deep device isolation pattern 150 may have a grid structure surrounding each of the plurality of pixel regions PX, when viewed in a plan view as shown, e.g., in FIG. 3. In some embodiments, the deep device isolation pattern 150 may extend from the first surface 100a of the substrate 100 to the second surface 100b of the substrate 100, and a bottom surface 150b of the deep device isolation pattern 150 may be substantially coplanar with the second surface 100b of the substrate 100. For example, the deep device isolation pattern 150 may include an insulating material of which a refractive index is lower than that of the substrate 100.

Referring to FIGS. 4 and 5, the deep device isolation pattern 150 may include an isolation pattern IP, a semiconductor pattern 157, and an insulating pattern 159. The isolation pattern IP may penetrate at least a portion of the substrate 100. The isolation pattern IP may be disposed between the pixel region PX and the semiconductor pattern 157. The isolation pattern IP may also be disposed between the substrate 100 and a side surface of the semiconductor pattern 157 and between the shallow device isolation pattern 103 and the insulating pattern 159. The isolation pattern IP may extend from the side surface of the semiconductor pattern 157 onto a side surface of the insulating pattern 159. The isolation pattern IP may fill a portion of the second trench TR2. The isolation pattern IP may cover an inner side surface of the second trench TR2. The isolation pattern IP may expose a bottom surface of the second trench TR2. The isolation pattern IP may surround each of the pixel regions PX when viewed in a plan view.

The isolation pattern IP may include a first isolation pattern 151 adjacent to the second surface 100b of the substrate 100, and a second isolation pattern 153 adjacent to the first surface 100a of the substrate 100. The first isolation pattern 151 may penetrate a portion of the substrate 100. The first isolation pattern 151 may extend from the second surface 100b of the substrate 100 into the substrate 100. The first isolation pattern 151 may be disposed between each of the pixel regions PX and the side surface of the semiconductor pattern 157. A top surface of the first isolation pattern 151 may be disposed in the substrate 100. A bottom surface of the first isolation pattern 151 may correspond to the bottom surface 150b of the deep device isolation pattern 150 and may be substantially coplanar with the second surface 100b of the substrate 100.

The second isolation pattern 153 may penetrate the shallow device isolation pattern 103 and may penetrate a portion of the substrate 100. The second isolation pattern 153 may extend from the first surface 100a of the substrate 100 into the substrate 100. A top surface of the second isolation pattern 153 may be substantially coplanar with the first surface 100a of the substrate 100. A bottom surface of the second isolation pattern 153 may be disposed in the substrate 100. The second isolation pattern 153 may extend from the side surface of the semiconductor pattern 157 onto the side surface of the insulating pattern 159. The second isolation pattern 153 may extend between the shallow device isolation pattern 103 and the insulating pattern 159.

A first interface IF1 at which the first isolation pattern 151 is in contact with the second isolation pattern 153 may be located at a lower level than a bottom surface of the shallow device isolation pattern 103. The first interface IF1 may be spaced apart from the shallow device isolation pattern 103. The first interface IF1 may be located at a lower level than a bottom surface of the first trench TR1. The term 'level' may mean a height from the second surface 100b of the substrate 100 toward the first surface 100a of the substrate 100.

The second isolation pattern 153 may include a lower portion 153BP disposed under the shallow device isolation pattern 103, and an upper portion 153UP penetrating the shallow device isolation pattern 103. The lower portion 153BP of the second isolation pattern 153 may have a first side surface 153OS adjacent to (or in contact with) the substrate 100, and a second side surface 153IS adjacent to (or in contact with) the semiconductor pattern 157. The first isolation pattern 151 may have a first side surface 151OS adjacent to (or in contact with) the substrate 100, and a second side surface 151IS adjacent to (or in contact with) the semiconductor pattern 157. The lower portion 153BP of the second isolation pattern 153 may be aligned with the first isolation pattern 151. More particularly, the first side surface 153OS of the lower portion 153BP of the second isolation pattern 153 may be aligned with the first side surface 151OS of the first isolation pattern 151, and the second side surface 153IS of the lower portion 153BP of the second isolation pattern 153 may be aligned with the second side surface 151IS of the first isolation pattern 151. The first side surface 153OS of the lower portion 153BP of the second isolation pattern 153 may be coplanar with the first side surface 151OS of the first isolation pattern 151, and the second side surface 153IS of the lower portion 153BP of the second isolation pattern 153 may be coplanar with the second side surface 151IS of the first isolation pattern 151. In other words, as shown, e.g., in FIGS. 4 and 5, the lower portion 153BP of the second isolation pattern 153 and the first isolation pattern 151 may not have a stepped surface therebetween.

The first isolation pattern 151 may include a different material from that of the second isolation pattern 153. For example, the first isolation pattern 151 may include a first insulating material, and the second isolation pattern 153 may include a second insulating material. The first insulating material and the second insulating material may be different materials. The first isolation pattern 151 may include, for example, a low refractive index (LRI) material. For example, a refractive index (n) of the first isolation pattern 151 may range from 1 to 2, in particular, from 11 to 1.5. The second isolation pattern 153 may include, for example, a high-k material. For example, a dielectric constant (k) of the second isolation pattern 153 may range from 4 to 25. In some embodiments, the first isolation pattern 151 may include a material having a refractive index (n) lower than that of the second isolation pattern 153. In some embodiments, the second isolation pattern 153 may include a material having a dielectric constant (k) higher than that of the first isolation pattern 151. However, embodiments are not limited thereto, and the first isolation pattern 151 may include the low refractive index (LRI) material, and the second isolation pattern 153 may include the high-k material. For example, the first isolation pattern 151 may include an oxide (e.g., silicon oxide). For example, the second isolation pattern 153 may include at least one of a nitride, a metal nitride, or a metal oxide. For example, the nitride may include silicon nitride. For example, the metal nitride may include at least one of tungsten nitride or hafnium nitride. For example, the metal oxide may include at least one of tungsten oxide or hafnium oxide.

A height 151H of the first isolation pattern 151 may be greater than a height 153H of the second isolation pattern 153. For example, the height 151H of the first isolation pattern 151 may range from 60% to 95% of a total height (151H+153H) of the isolation pattern IP. For example, the height 151H of the first isolation pattern 151 may range from 3 times to 10 times the height 153H of the second isolation pattern 153. For example, the height 151H of the first isolation pattern 151 may range from 1 μm to 10 μm. The term 'height' may mean a distance measured in a direction (e.g., a third direction D3) perpendicular to the second surface 100b of the substrate 100.

The semiconductor pattern 157 may penetrate at least a portion of the substrate 100. The semiconductor pattern 157 may be disposed between the plurality of pixel regions PX. The semiconductor pattern 157 may fill a lower portion of the second trench TR2. The semiconductor pattern 157 may cover the bottom surface of the second trench TR2. The semiconductor pattern 157 may cover an inner side surface of the first isolation pattern 151 and may be in contact with the first isolation pattern 151. A top surface of the semiconductor pattern 157 may be located at a lower level than the first surface 100a of the substrate 100. A bottom surface of the semiconductor pattern 157 may correspond to the bottom surface 150b of the deep device isolation pattern 150 and may be substantially coplanar with the second surface 100b of the substrate 100. The semiconductor pattern 157 may include a conductive material, for example, a semiconductor material doped with dopants. The dopants may have a P-type or an N-type. For example, the semiconductor pattern 157 may include doped poly-silicon.

The insulating pattern 159 may be disposed on the semiconductor pattern 157. The insulating pattern 159 may be disposed in the shallow device isolation pattern 103. The insulating pattern 159 may penetrate the shallow device isolation pattern 103 so as to be in contact with the semiconductor pattern 157. The insulating pattern 159 may be spaced apart from the shallow device isolation pattern 103 by the second isolation pattern 153. For example, the insulating pattern 159 may include at least one of silicon oxide, silicon nitride, or silicon oxynitride.

According to an embodiment, the isolation pattern IP of the deep device isolation pattern 150 may include at least two or more isolation patterns including different materials. More particularly, the first isolation pattern 151 adjacent to the second surface 100b of the substrate 100 to which light will be incident may include the low refractive index (LRI) material, and the second isolation pattern 153 adjacent to the first surface 100a of the substrate 100 may include the high-k material. Accordingly, incident light may be totally reflected by the first isolation pattern 151, and thus cross-talk between the pixel regions PX adjacent to each other may be effectively prevented and a loss of light sensitivity may be minimized. In addition, noise may be minimized by the second isolation pattern 153, and thus a signal-to-noise ratio (SNR) may be improved.

Referring again to FIGS. 3 and 4 transfer transistors TX and logic transistors RX, SX and DX may be disposed on the first surface 100a of the substrate 100. Each of the transistors TX, RX, SX and DX may be disposed on a corresponding active region ACT of each of the pixel regions PX. The transfer transistor TX may include a transfer gate TG and a floating diffusion region FD, which are disposed on and in a corresponding active region ACT, respectively. A lower portion of the transfer gate TG may be inserted in the substrate 100, and an upper portion of the transfer gate TG may protrude above the first surface 100a of the substrate 100. A gate dielectric layer GI may be disposed between the transfer gate TG and the substrate 100. The floating diffusion region FD may be disposed in the corresponding active region ACT at a side of the transfer gate TG. The floating diffusion region FD may be a region doped with dopants (e.g., N-type dopants) having the second conductivity type different from the first conductivity type of the substrate 100.

The drive transistor DX may include a drive gate SFG on a corresponding active region ACT, and the selection transistor SX may include a selection gate SG on a corresponding active region ACT. The reset transistor RX may include a reset gate RG on a corresponding active region ACT. An additional gate dielectric layer GI may be disposed between each of the drive, selection and reset gates SFG, SG and RG and the substrate 100.

The interconnection layer 20 may be disposed on the first surface 100a of the substrate 100. The interconnection layer 20 may include a first interlayer insulating layer 210, a second interlayer insulating layer 220 and a third interlayer insulating layer 230, which are sequentially stacked on the first surface 100a of the substrate 100. The interconnection layer 20 may further include contact plugs BCP in the first interlayer insulating layer 210, first interconnection patterns 222 in the second interlayer insulating layer 220, and second interconnection patterns 232 in the third interlayer insulating layer 230. The first interlayer insulating layer 210 may be disposed on the first surface 100a of the substrate 100 to cover the transistors TX, RX, SX and DX, and the contact plugs BCP may be connected to terminals of the transistors TX, RX, SX and DX. The contact plugs BCP may be connected to corresponding ones of the first interconnection patterns 222, and the first interconnection patterns 222 may be connected to corresponding ones of the second interconnection patterns 232. The first and second interconnection patterns 222 and 232 may be electrically connected to the transistors TX, RX, SX and DX through the contact plugs BCP. Each of the first to third interlayer insulating layers 210, 220 and 230 may include an insulating material, and the contact plugs BCP, the first interconnection patterns 222 and the second interconnection patterns 232 may include a conductive material.

The light transmitting layer 30 may be disposed on the second surface 100b of the substrate 100. The light transmitting layer 30 may include a plurality of color filters CF and a plurality of micro lenses 330. The light transmitting layer 30 may collect and filter light incident from the outside and may provide the light to the photoelectric conversion layer 10.

The micro lenses 330 may be provided on the second surface 100b of the substrate 100. Each of the micro lenses 330 may vertically (e.g., in the third direction D3) overlap with the photoelectric conversion region PD of a corresponding pixel region PX. The micro lenses 330 may have convex shapes to concentrate or collect light incident to the pixel regions PX.

The color filters CF may be disposed between the second surface 100b of the substrate 100 and the micro lenses 330. Each of the color filters CF may vertically (e.g., in the third direction D3) overlap with the photoelectric conversion region PD of a corresponding pixel region PX. Each of the color filters CF may include a red, green or blue color filter, depending on a corresponding unit pixel. The color filters CF may be two-dimensionally arranged, and in certain embodiments, each of the color filters CF may include a yellow filter, a magenta filter, or a cyan filter.

An anti-reflection layer 310 may be disposed on the second surface 100b of the substrate 100. The anti-reflection layer 310 may be disposed between the second surface 100b of the substrate 100 and the color filters CF. The anti-reflection layer 310 may conformally cover the second surface 100b of the substrate 100. The anti-reflection layer 310 may prevent reflection of light incident to the second surface 100b of the substrate 100 to allow the light to smoothly reach the photoelectric conversion region PD. For example, the anti-reflection layer 310 may include at least one of silicon oxide, silicon nitride, silicon oxynitride, or a high-k dielectric material (e.g., hafnium oxide or aluminum oxide).

A first passivation layer 312 may be disposed between the anti-reflection layer 310 and the color filters CF. A second passivation layer 322 may be disposed between the color filters CF and the micro lenses 330. The first passivation layer 312 may conformally cover the anti-reflection layer 310. The first passivation layer 312 may include at least one of, for example, a metal oxide or a nitride. For example, the metal oxide may include aluminum oxide, and the nitride may include silicon nitride.

A grid pattern 315 may be provided between the pixel regions PX. The grid pattern 315 may be disposed between the first passivation layer 312 and the color filters CF. The grid pattern 315 may vertically overlap with the deep device isolation pattern 150. The grid pattern 315 may have a lattice or grid shape when viewed in a plan view. The grid pattern 315 may guide light incident to the second surface 100b of the substrate 100 in such a way that the light is incident into the photoelectric conversion region PD. The grid pattern 315 may include at least one of a metal material or a low refractive index (LRI) material. The metal material may include at least one of, for example, tungsten or titanium. For example, the low refractive index (LRI) material may include at least one of materials having refractive indexes lower than refractive indexes of silicon oxide and the color filters CF.

Figure 6:
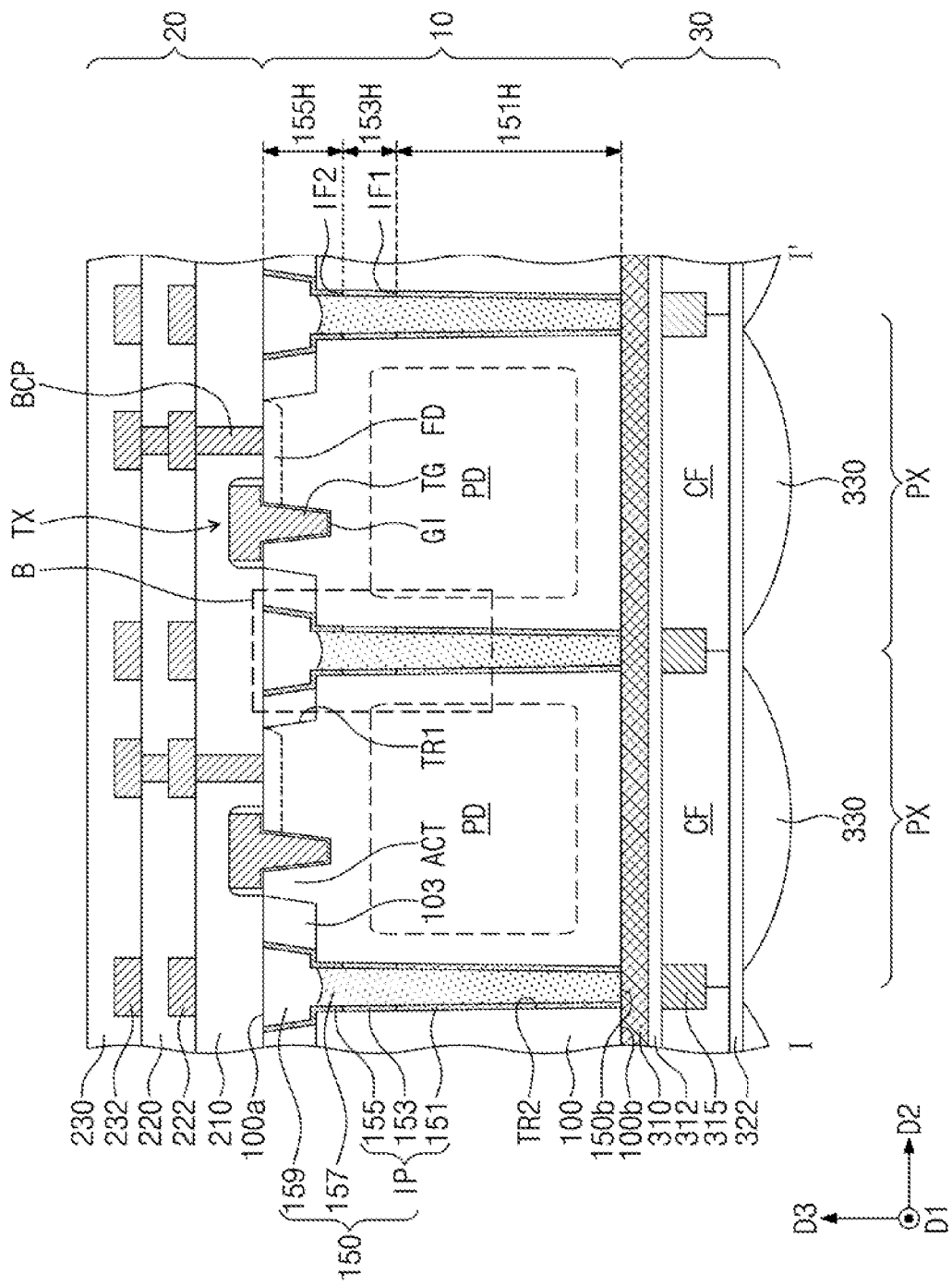
FIG. 6 is a cross-sectional view taken along the line I-I' of FIG. 3 to illustrate an image sensor according to an example embodiment.
Figure 7:
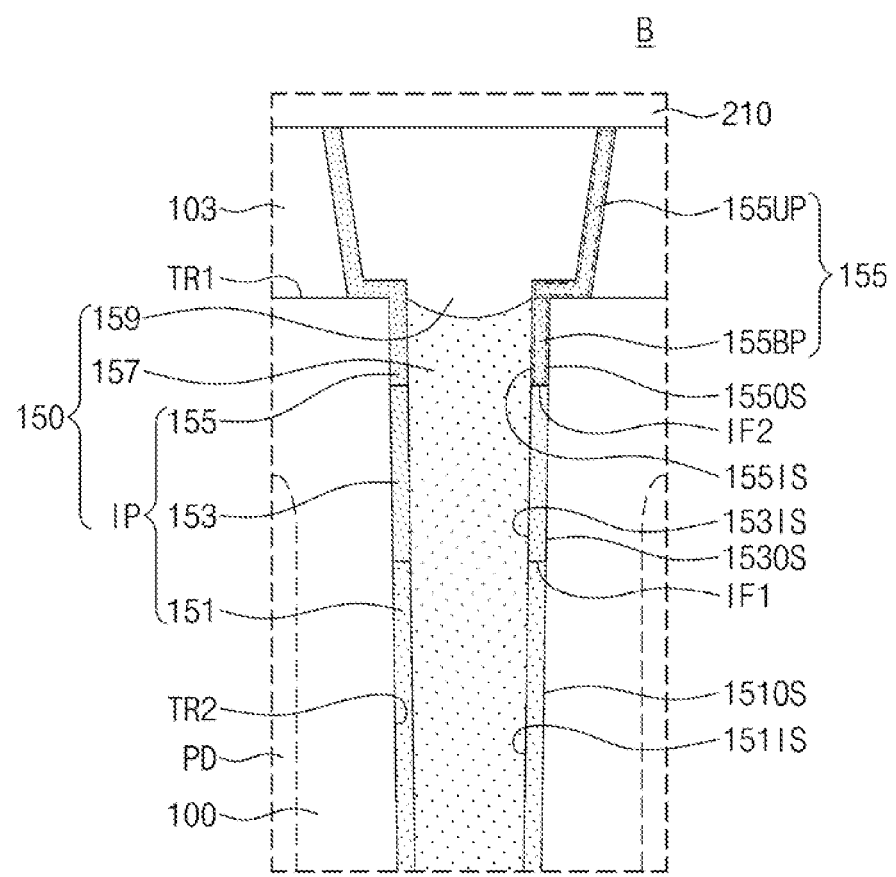
FIG. 7 is an enlarged view of a portion 'B' of FIG. 6.

FIG. 6 is a cross-sectional view taken along the line I-I' of FIG. 3 to illustrate an image sensor according to an example embodiment. FIG. 7 is an enlarged view of a portion 'B' of FIG. 6. Hereinafter, differences between the present embodiments and the above embodiments of FIGS. 1 to 5 will be mainly described for the purpose of ease and convenience in explanation.

Referring to FIGS. 6 and 7, an image sensor according to an example embodiment may include a photoelectric conversion layer 10, an interconnection layer 20, and a light transmitting layer 30.

A deep device isolation pattern 150 may include an isolation pattern IP, a semiconductor pattern 157, and an insulating pattern 159. The isolation pattern IP may include a first isolation pattern 151, a second isolation pattern 153, and a third isolation pattern 155. The third isolation pattern 155 may be disposed in the substrate 100. The third isolation pattern 155 may be disposed on the second isolation pattern 153 and may be disposed between the first surface 100a of the substrate 100 and the second isolation pattern 153.

The third isolation pattern 155 may penetrate the shallow device isolation pattern 103 and may penetrate a portion of the substrate 100. The third isolation pattern 155 may extend from the first surface 100a of the substrate 100 into the substrate 100. A top surface of the third isolation pattern 155 may be substantially coplanar with the first surface 100a of the substrate 100. A bottom surface of the third isolation pattern 155 may be disposed in the substrate 100. The third isolation pattern 155 may extend from the side surface of the semiconductor pattern 157 onto the side surface of the insulating pattern 159. The third isolation pattern 155 may extend between the shallow device isolation pattern 103 and the insulating pattern 159.

A second interface IF2 at which the second isolation pattern 153 is in contact with the third isolation pattern 155 may be located at a lower level than the bottom surface of the shallow device isolation pattern 103. The second interface IF2 may be spaced apart from the shallow device isolation pattern 103. The second interface IF2 may be located at a lower level than the bottom surface of the first trench TR1.

The third isolation pattern 155 may include a lower portion 155BP disposed under the shallow device isolation pattern 103, and an upper portion 155UP penetrating the shallow device isolation pattern 103. The lower portion 155BP of the third isolation pattern 155 may have a first side surface 155OS adjacent to (or in contact with) the substrate 100, and a second side surface 155IS adjacent to (or in contact with) the semiconductor pattern 157. The second isolation pattern 153 may have a first side surface 153OS adjacent to (or in contact with) the substrate 100, and a second side surface 153IS adjacent to (or in contact with) the semiconductor pattern 157. The lower portion 155BP of the third isolation pattern 155 may be aligned with the second isolation pattern 153. More particularly, the first side surface 155OS of the lower portion 155BP of the third isolation pattern 155 may be aligned with the first side surface 153OS of the second isolation pattern 153, and the second side surface 155IS of the lower portion 155BP of the third isolation pattern 155 may be aligned with the second side surface 153IS of the second isolation pattern 153. The first side surface 155OS of the lower portion 155BP of the third isolation pattern 155 may be coplanar with the first side surface 153OS of the second isolation pattern 153, and the second side surface 155IS of the lower portion 155BP of the third isolation pattern 155 may be coplanar with the second side surface 153IS of the second isolation pattern 153. In other words, as shown, e.g., in FIGS. 6 and 7, the lower portion 155BP of the third isolation pattern 155 and the second isolation pattern 153 may not have a stepped surface therebetween.

The third isolation pattern 155 may include a different material from that of the second isolation pattern 153. The third isolation pattern 155 may include an insulating material (e.g., a third insulating material), for example, a high-k material. For example, a dielectric constant (k) of the third isolation pattern 155 may range from 4 to 25. For example, the third isolation pattern 155 may include a material having a dielectric constant (k) higher than that of the second isolation pattern 153. However, embodiments are not limited thereto. The third isolation pattern 155 may include at least one of, for example, a nitride, a metal nitride, or a metal oxide. For example, the nitride may include silicon nitride. For example, the metal nitride may include at least one of tungsten nitride or hafnium nitride. For example, the metal oxide may include at least one of tungsten oxide or hafnium oxide.

In some embodiments, a height 151H of the first isolation pattern 151 may be greater than a total height (153H+155H) of the second isolation pattern 153 and the third isolation pattern 155. For example, the height 151H of the first isolation pattern 151 may range from 3 times to 10 times the total height (153H+155H) of the second isolation pattern 153 and the third isolation pattern 155. Except for the descriptions to the third isolation pattern 155, other components and features of the image sensor according to the present embodiments may be substantially the same as corresponding components and features of the image sensor described above with reference to FIGS. 1 to 5.

FIGS. 8 to 14 are cross-sectional views corresponding to the line I-I' of FIG. 3 to illustrate a method of manufacturing an image sensor according to an example embodiment. The descriptions to the same features as described with reference to FIGS. 1 to 5 will be omitted or mentioned briefly for the purpose of ease and convenience in explanation.

Figure 8:
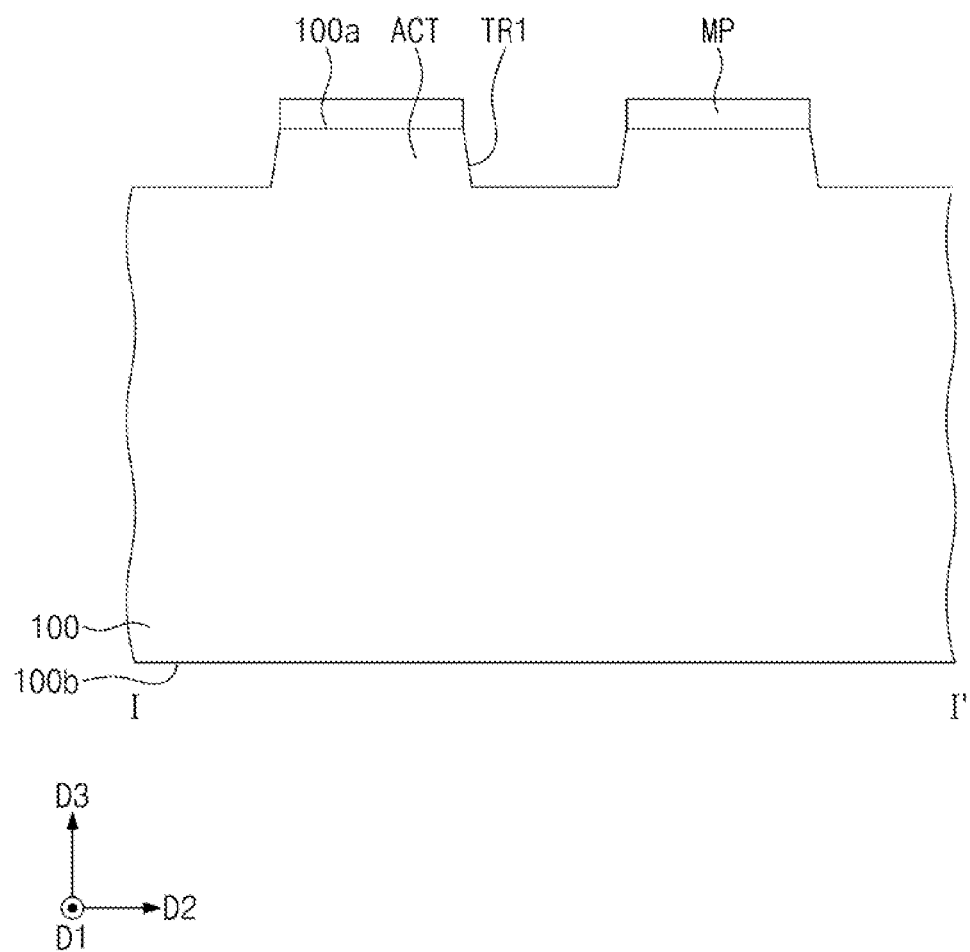
FIGS. 8 to 14 are cross-sectional views corresponding to the line I-I' of FIG. 3 to illustrate a method of manufacturing an image sensor according to an example embodiment.

Referring to FIGS. 3 and 8, a substrate 100 having a first surface 100a and a second surface 100b which are opposite to each other may be provided. A first trench TR1 may be formed adjacent to the first surface 100a of the substrate 100. The formation of the first trench TR1 may include forming a first mask pattern MP on the first surface 100a of the substrate 100, and etching the substrate 100 using the first mask pattern MP as an etch mask. The first trench TR1 may define active regions ACT in the substrate 100.

Figure 9:
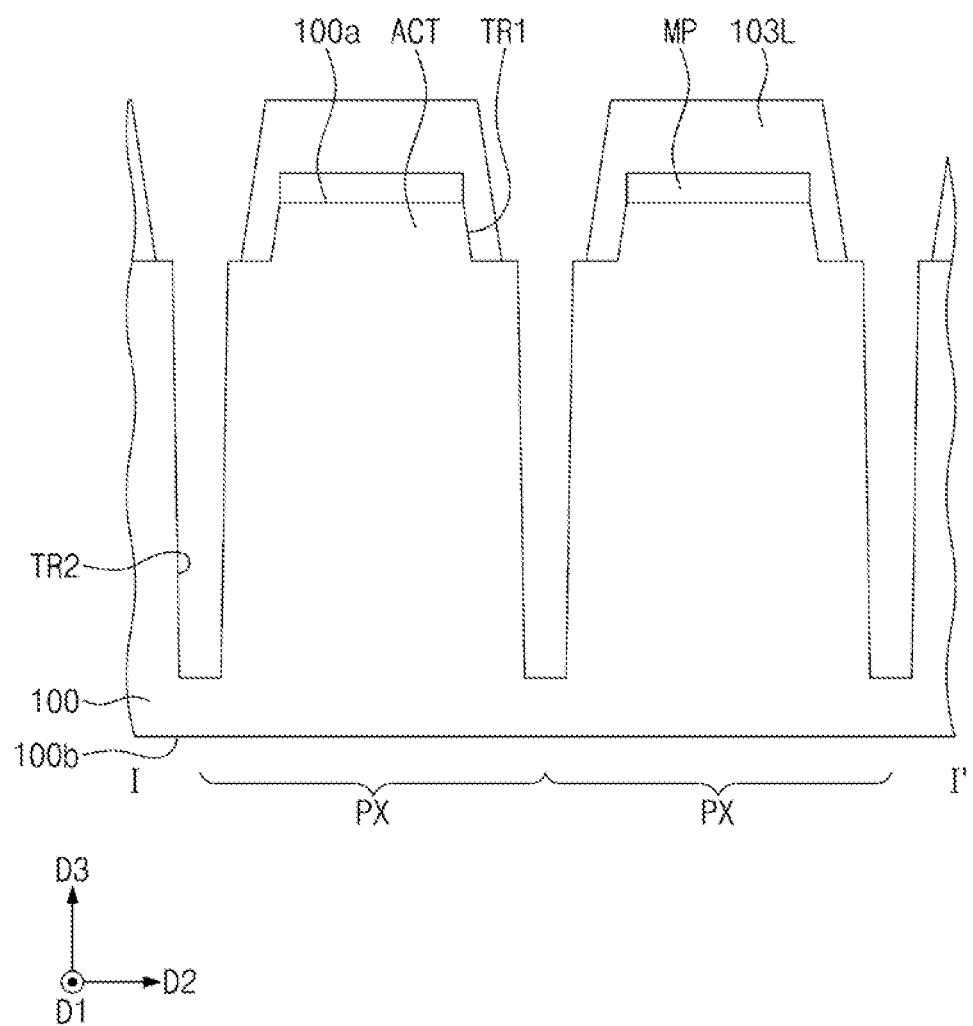

Referring to FIGS. 3 and 9, a device isolation layer 103L may be formed on the first surface 100a of the substrate 100. The device isolation layer 103L may fill the first trench TR1 and may cover the first mask pattern MP. The device isolation layer 103L may include at least one of, for example, silicon oxide, silicon nitride, or silicon oxynitride.

Referring to FIGS. 3 and 9, a second trench TR2 may be formed in the substrate 100. The formation of the second trench TR2 may include forming a second mask pattern defining a region, in which the second trench TR2 will be formed, on the device isolation layer 103L, and etching the device isolation layer 103L and the substrate 100 using the second mask pattern as an etch mask. A bottom surface of the second trench TR2 may be located at a higher level than the second surface 100b of the substrate 100. The device isolation layer 103L may be etched more than the substrate 100, and thus an upper region of the second trench TR2 may be further expanded and a portion of a bottom surface of the first trench TR1 may be exposed. A plurality of pixel regions PX may be defined in the substrate 100 by the second trench TR2. Each of the pixel regions PX may include the active regions ACT defined by the first trench TR1.

Figure 10:
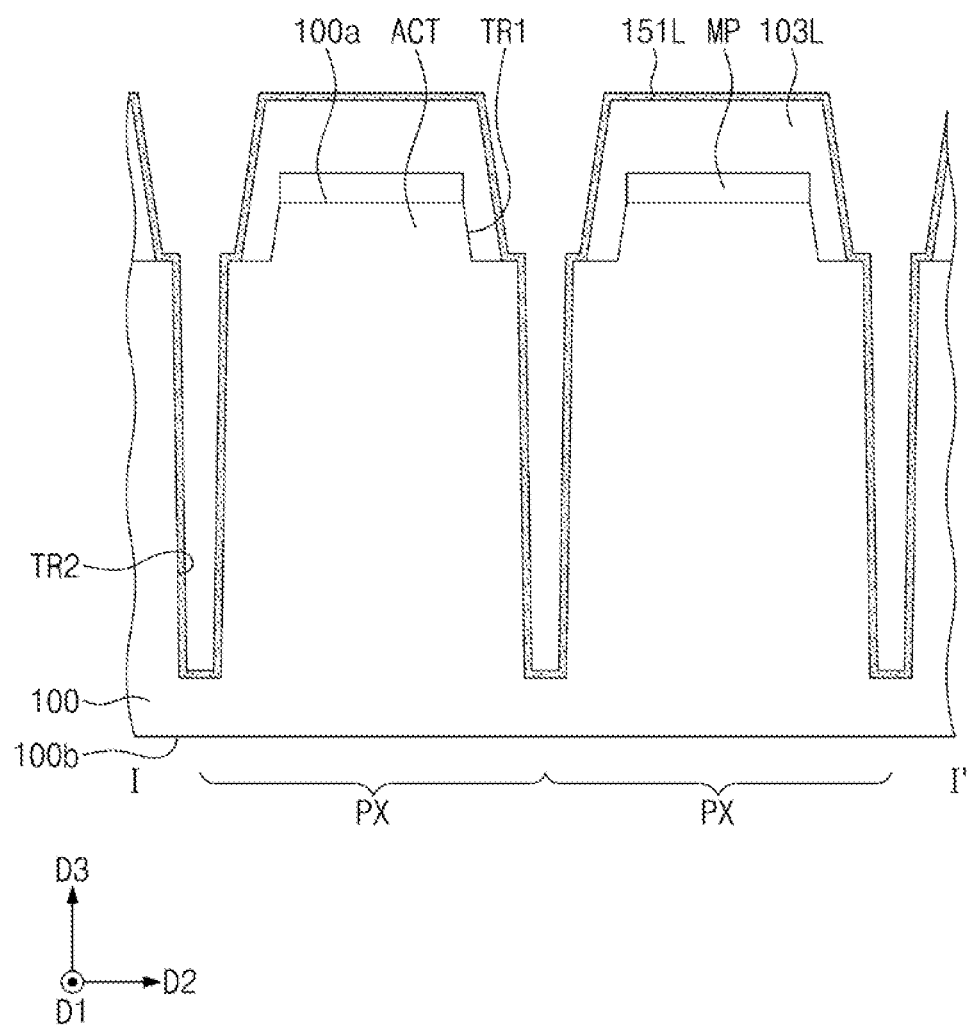

Referring to FIGS. 3 and 10, a first isolation layer 151L may be formed on the substrate 100. The first isolation layer 151L may conformally cover an inner surface (i.e., an inner side surface and the bottom surface) of the second trench TR2. The first isolation layer 151L may cover the portion of the bottom surface of the first trench TR1, which is exposed by the second trench TR2. The first isolation layer 151L may conformally cover the expanded upper region of the second trench TR2 and may extend to cover a top surface of the device isolation layer 103L. For example, the first isolation layer 151L may include an insulating material, e.g., a low refractive index (LRI) material. For example, the first isolation layer 151L may include an oxide such as silicon oxide.

Figure 11:
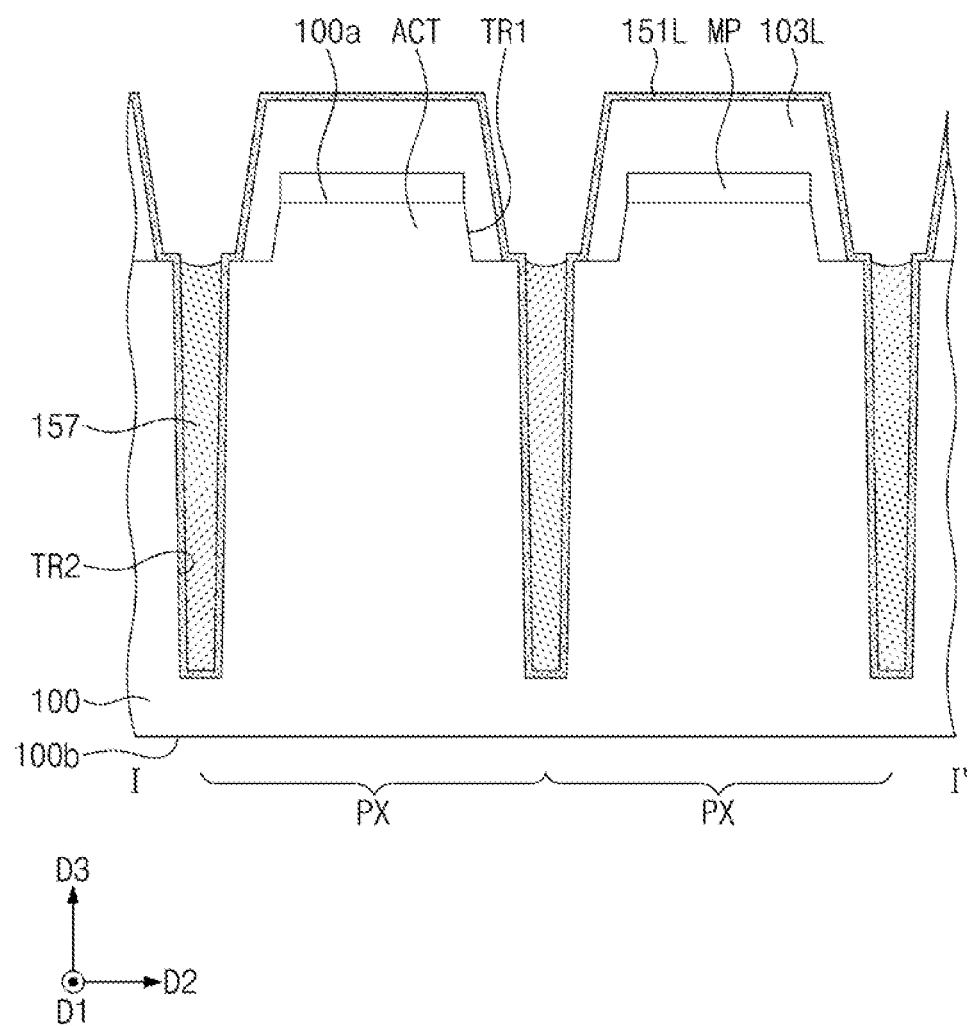

Referring to FIGS. 3 and 11, a semiconductor pattern 157 may be formed to fill a lower region of the second trench TR2. The formation of the semiconductor pattern 157 may include forming a conductive layer filling the second trench TR2, and etching the conductive layer by an etch-back process. The conductive layer may include a conductive material, for example, a semiconductor material doped with dopants. For example, the conductive layer may include doped poly-silicon.

Figure 12:
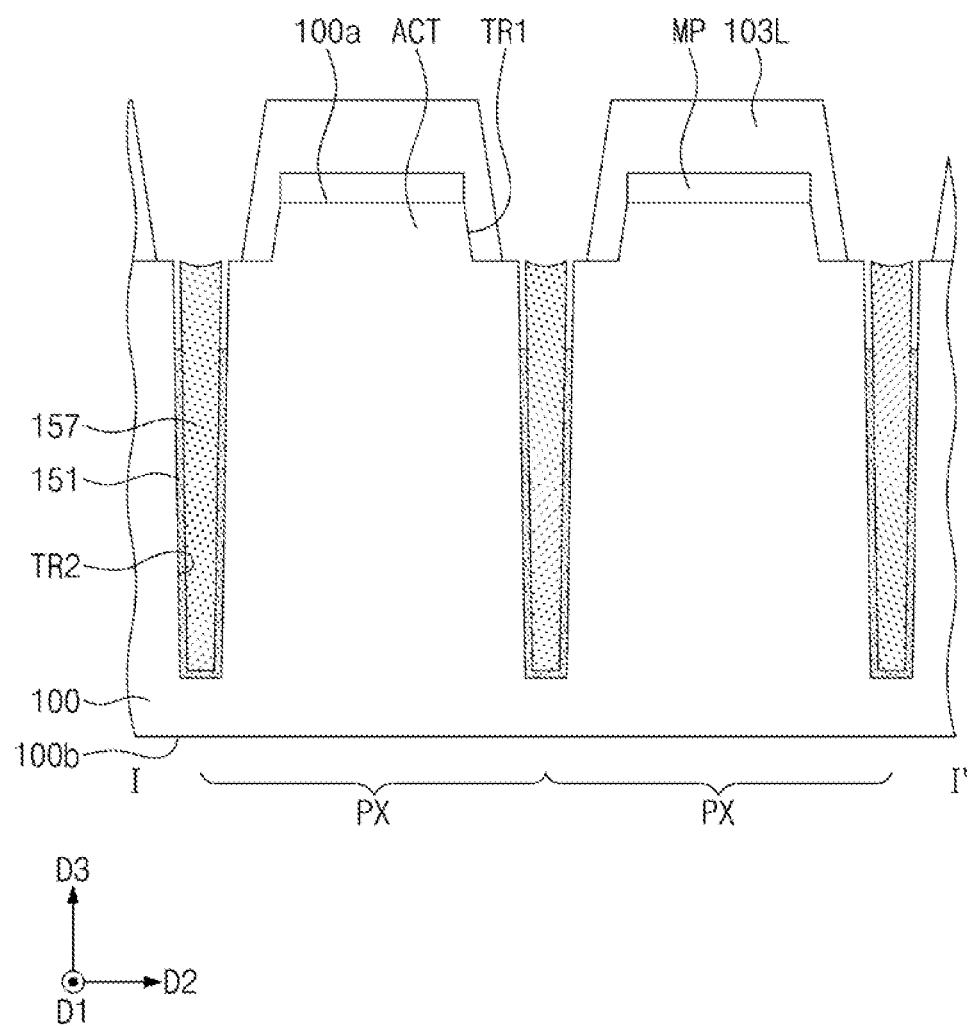

Referring to FIGS. 3 and 12, an etching process may be performed to form a first isolation pattern 151. The formation of the first isolation pattern 151 may include etching a portion of the first isolation layer 151L. By the etching process, the first isolation layer 151L exposed by the semiconductor pattern 157 may be removed and a portion of the first isolation layer 151L disposed in an upper portion of the second trench TR2 may be removed. Thus, an empty space may be formed between an upper portion of the second trench TR2 and an upper portion of the semiconductor pattern 157, and a top surface of the first isolation pattern 151 may be exposed. For example, the etching process may be a wet etching process using an etchant, and an etch rate of the first isolation layer 151L by the etchant may be higher than those of the substrate 100 and the semiconductor pattern 157 by the etchant. A process time of the etching process and/or a concentration of the etchant may be appropriately adjusted, and thus the whole of the first isolation layer 151L may not be removed.

Figure 13:
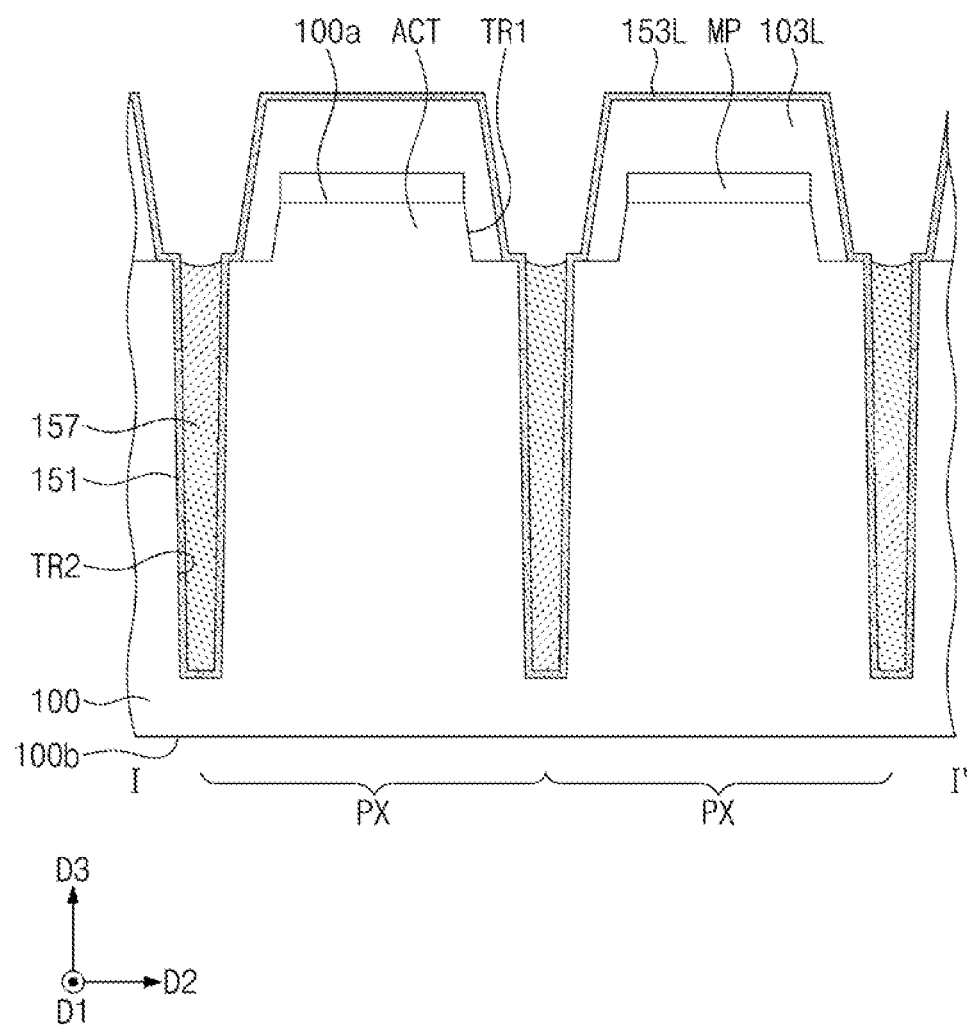

Referring to FIGS. 3 and 13, a second isolation layer 153L may be formed on the substrate 100. The second isolation layer 153L may fill the empty space between the upper portion of the second trench TR2 and the upper portion of the semiconductor pattern 157. The second isolation layer 153L may conformally cover the expanded upper region of the second trench TR2 and may extend to cover the top surface of the device isolation layer 103L. For example, the second isolation layer 153L may include an insulating material e.g., a high-k material. For example, the second isolation layer 153L may include at least one of a nitride, a metal nitride, or a metal oxide. For example, the nitride may include silicon nitride. For example, the metal nitride may include at least one of tungsten nitride or hafnium nitride. For example, the metal oxide may include at least one of tungsten oxide or hafnium oxide.

Figure 14:
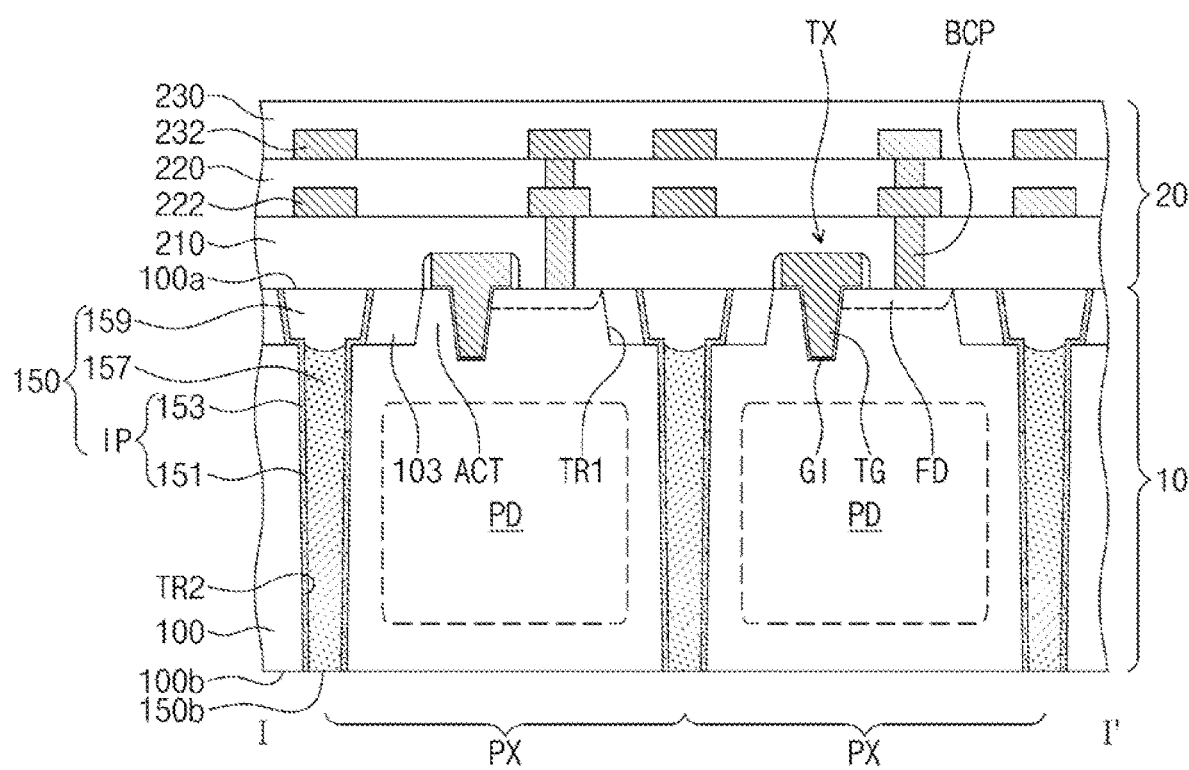
Figure 14:
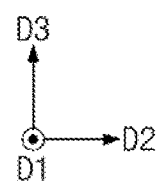

Referring to FIGS. 3 and 14, an insulating pattern 159 may be formed to fill the upper region of the second trench TR2. For example, the formation of the insulating pattern 159 may include forming an insulating layer filling a remaining portion of the second trench TR2 on the substrate 100 having the semiconductor pattern 157, and planarizing the insulating layer, the second isolation layer 153L and the device isolation layer 103L until the first surface 100a of the substrate 100 is exposed. The insulating layer may include at least one of, for example, silicon oxide, silicon nitride, or silicon oxynitride. The first mask pattern MP may be removed by the planarization process. The insulating pattern 159, a second isolation pattern 153 and a shallow device isolation pattern 103 may be formed by the planarizing of the insulating layer, the second isolation layer 153L and the device isolation layer 103L, respectively. The first isolation pattern 151 and the second isolation pattern 153 may be referred to as an isolation pattern IP. Thus, a deep device isolation pattern 150 including the isolation pattern IP, the semiconductor pattern 157 and the insulating pattern 159 may be formed.

A photoelectric conversion region PD may be formed in each of the plurality of pixel regions PX. For example, the formation of the photoelectric conversion region PD may include injecting dopants having the second conductivity type (e.g., an N-type) different from the first conductivity type (e.g., a P-type) into the substrate 100.

Transistors TX, RX, SX and DX may be formed on the first surface 100a of the substrate 100 and may be formed on each of the pixel regions PX. For example, the formation of a transfer transistor TX may include forming a floating diffusion region FD by doping a portion of a corresponding active region ACT with dopants, and forming a transfer gate TG on the corresponding active region ACT. The formation of a drive transistor DX, a selection transistor SX and a reset transistor RX may include forming dopant regions by doping portions of corresponding active regions ACT with dopants, and forming a drive gate SFG, a selection gate SG and a reset gate RG on the corresponding active regions ACT.

Referring to FIG. 14, an interconnection layer 20 may be formed on the first surface 100a of the substrate 100. More particularly, a first interlayer insulating layer 210 may be formed on the first surface 100a of the substrate 100 and may cover the transistors TX, RX, SX and DX. Contact plugs BCP may be formed in the first interlayer insulating layer 210 and may be connected to terminals of the transistors TX, RX, SX and DX. A second interlayer insulating layer 220 and a third interlayer insulating layer 230 may be sequentially formed on the first interlayer insulating layer 210. First interconnection patterns 222 and second interconnection patterns 232 may be formed in the second interlayer insulating layer 220 and the third interlayer insulating layer 230, respectively. The first and second interconnection patterns 222 and 232 may be electrically connected to the transistors TX, RX, SX and DX through the contact plugs BCP.

A thinning process may be performed on the second surface 100b of the substrate 100. Portions of the substrate 100 and the deep device isolation pattern 150 may be removed by the thinning process. Due to the thinning process, a lower portion of the deep device isolation pattern 150 may be removed, and a bottom surface 150b of the deep device isolation pattern 150 may be substantially coplanar with the second surface 100b of the substrate 100. A photoelectric conversion layer 10 may be formed by the manufacturing processes described above.

Referring again to FIGS. 3 and 4, a light transmitting layer 30 may be formed on the second surface 100b of the substrate 100. In detail, an anti-reflection layer 310 and a first passivation layer 312 may be sequentially formed on the second surface 100b of the substrate 100. A grid pattern 315 may be formed on the first passivation layer 312 and may vertically overlap with the deep device isolation pattern 150. For example, the formation of the grid pattern 315 may include depositing a metal layer on the first passivation layer 312, and patterning the metal layer. Color filters CF may be formed on the first passivation layer 312 and may be formed to cover the grid pattern 315. The color filters CF may be disposed on the pixel regions PX, respectively. A second passivation layer 322 may be formed on the color filters CF, and micro lenses 330 may be formed on the second passivation layer 322.

Figure 15:
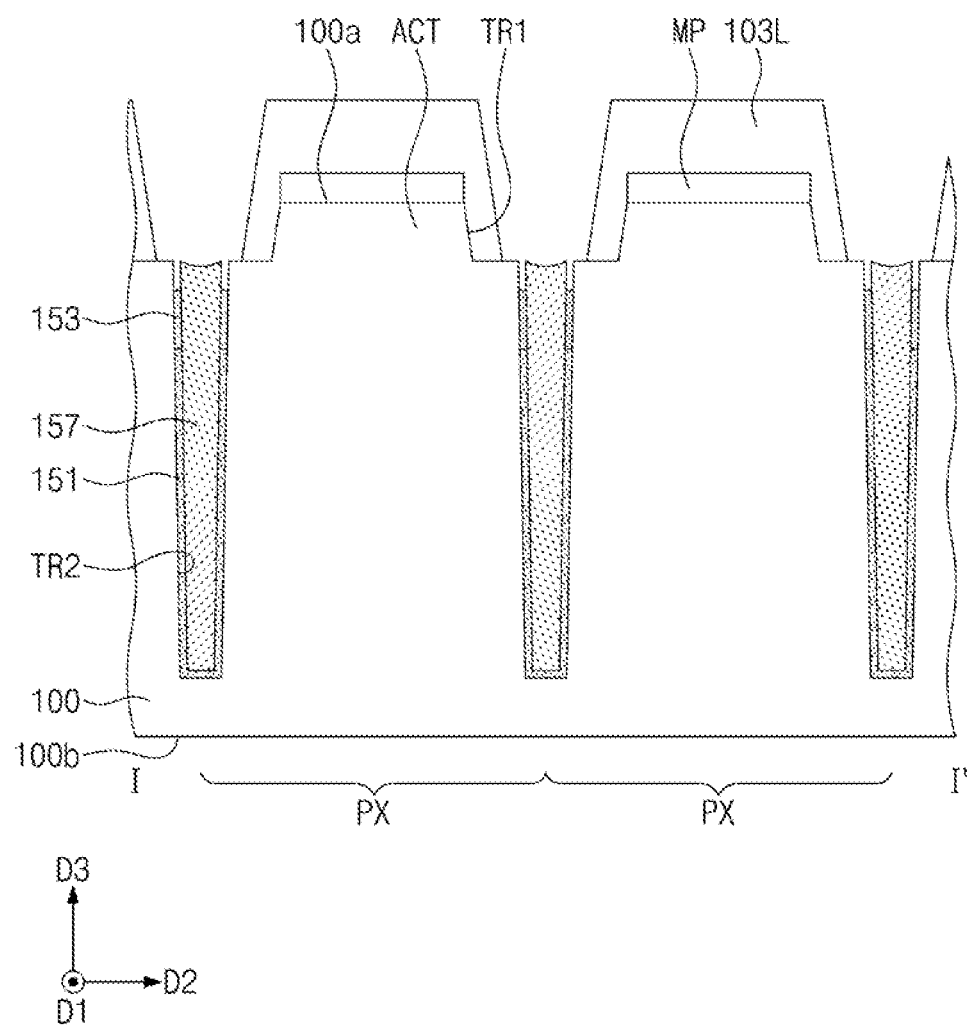
FIGS. 15 to 17 are cross-sectional views corresponding to the line I-I' of FIG. 3 to illustrate a method of manufacturing an image sensor according to an example embodiment.
Figure 16:
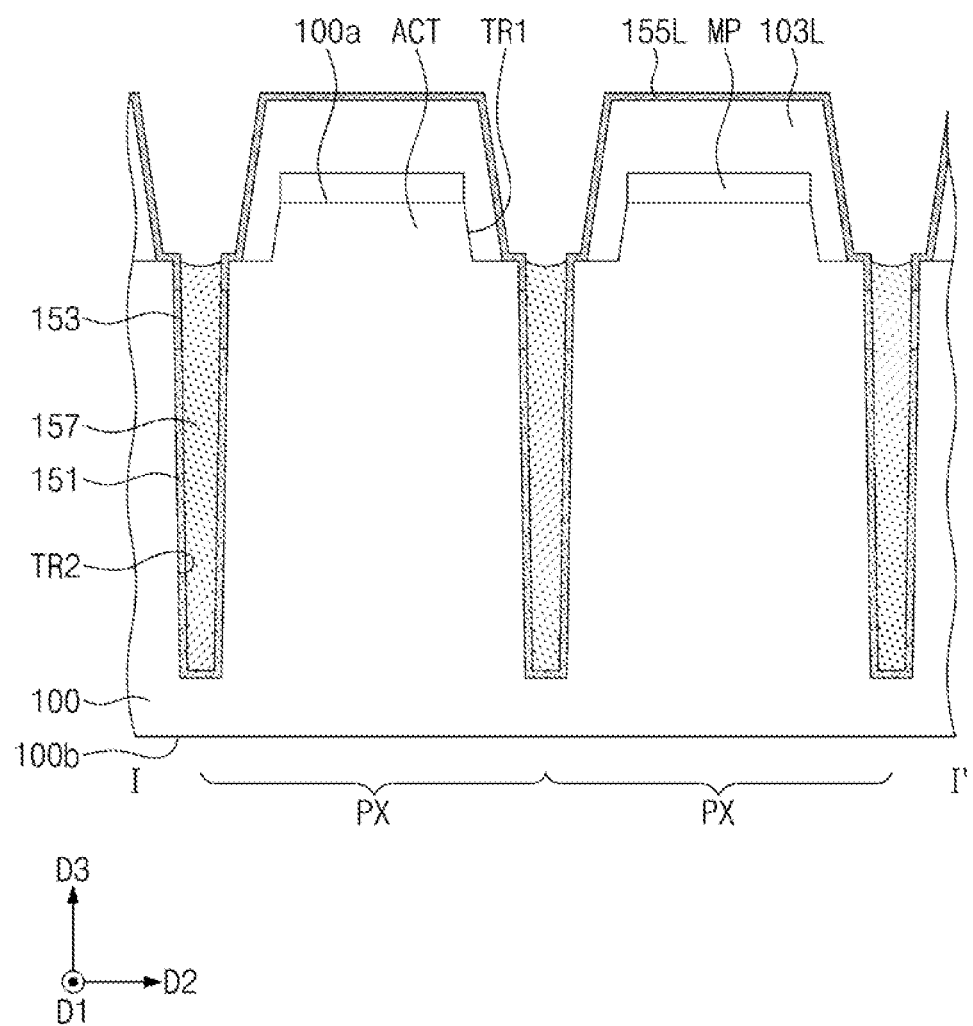
Figure 17:
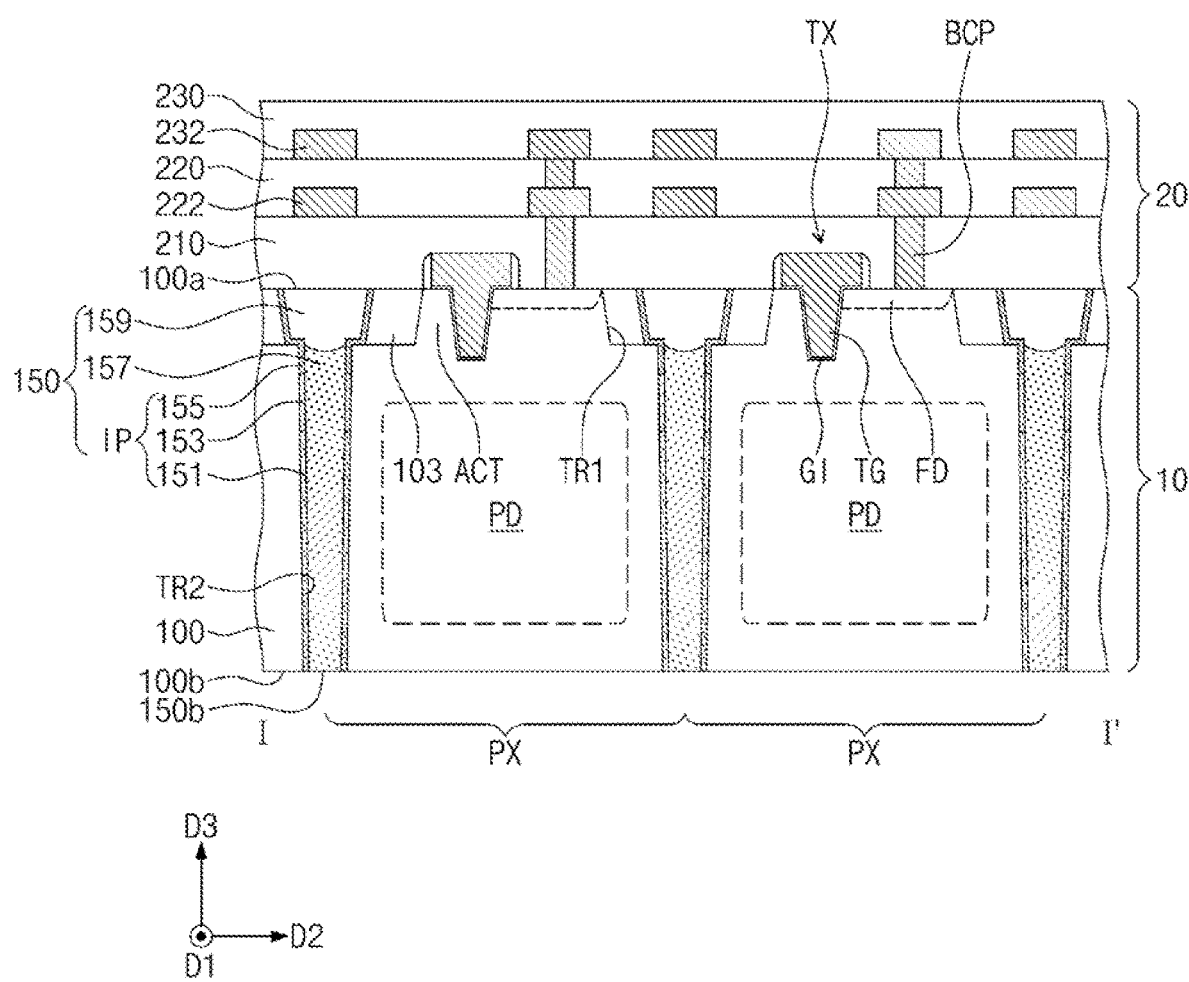

FIGS. 15 to 17 are cross-sectional views corresponding to the line I-I' of FIG. 3 to illustrate a method of manufacturing an image sensor according to an example embodiment. Hereinafter, the descriptions to the same features as described with reference to FIGS. 8 to 13 will be omitted for the purpose of ease and convenience in explanation.

Referring to FIGS. 3, 13 and 15 after the formation of the second isolation layer 153L, the second isolation layer 153L may be etched to form a second isolation pattern 153. The formation of the second isolation pattern 153 may include etching a portion of the second isolation layer 153L. By the etching process, the second isolation layer 153L exposed by the semiconductor pattern 157 may be removed and a portion of the second isolation layer 153L disposed in an upper portion of the second trench TR2 may be removed. Thus, an empty space may be formed between an upper portion of the second trench TR2 and an upper portion of the semiconductor pattern 157, and a top surface of the second isolation pattern 153 may be exposed. For example, the etching process may be a wet etching process using an etchant, and an etch rate of the second isolation layer 153L by the etchant may be higher than those of the substrate 100 and the semiconductor pattern 157 by the etchant. Since a process time of the etching process and/or a concentration of the etchant is/are appropriately adjusted, the whole of the second isolation layer 153L may not be removed.

Referring to FIGS. 3 and 16, a third isolation layer 155L may be formed on the substrate 100. The third isolation layer 155L may fill the empty space between the upper portion of the second trench TR2 and the upper portion of the semiconductor pattern 157. The third isolation layer 155L may conformally cover the expanded upper region of the second trench TR2 and may extend to cover the top surface of the device isolation layer 103L. The third isolation layer 155L may include a different material from that of the second isolation pattern 153. For example, the third isolation layer 155L may include an insulating material, e.g., a high-k material. For example, the third isolation layer 155L may include at least one of a nitride, a metal nitride, or a metal oxide. For example, the nitride may include silicon nitride. For example, the metal nitride may include at least one of tungsten nitride or hafnium nitride. For example, the metal oxide may include at least one of tungsten oxide or hafnium oxide.

Referring to FIG. 17, an insulating pattern 159 may be formed to fill the upper region of the second trench TR2. The insulating pattern 159 may be formed by the same method as described above with reference to FIG. 14. The first isolation pattern 151, the second isolation pattern 153 and the third isolation pattern 155 may be referred to as an isolation pattern IP. Thus, a deep device isolation pattern 150 including the isolation pattern IP, the semiconductor pattern 157 and the insulating pattern 159 may be formed.

An interconnection layer 20 may be formed on the first surface 100a of the substrate 100. Transistors TX, RX, SX and DX may be formed on the first surface 100a of the substrate 100, and a thinning process may be performed on the second surface 100b of the substrate 100 to form a photoelectric conversion layer 10. The interconnection layer 20 and the photoelectric conversion layer 10 may be formed by substantially the same method as described above with reference to FIG. 14.

Referring again to FIGS. 3 and 6, a light transmitting layer 30 may be formed on the second surface 100b of the substrate 100. The light transmitting layer 30 may be formed by the same method as described above with reference to FIG. 4.

Figure 18:
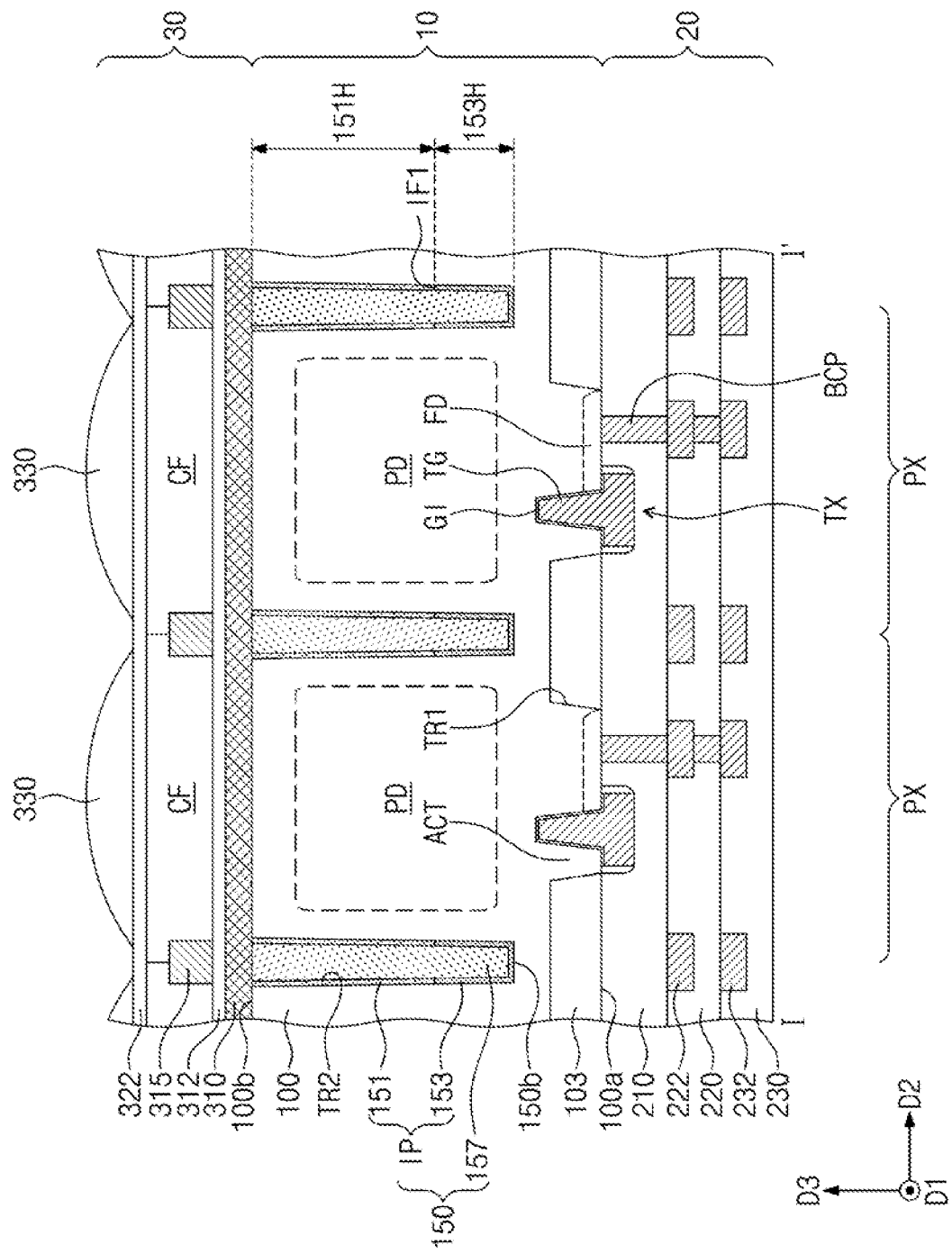
FIG. 18 is a cross-sectional view taken along the line I-I' of FIG. 3 to illustrate an image sensor according to an example embodiment.

FIG. 18 is a cross-sectional view taken along the line I-I' of FIG. 3 to illustrate an image sensor according to an example embodiment. Hereinafter, differences between the present embodiments and the above embodiments of FIGS. 1 to 4 will be mainly described for the purpose of ease and convenience in explanation.

Referring to FIG. 18, an image sensor according to an example embodiment may include a photoelectric conversion layer 10, an interconnection layer 20, and a light transmitting layer 30. The photoelectric conversion layer 10 may include a substrate 100 including pixel regions PX, and a deep device isolation pattern 150 disposed in the substrate 100 between the pixel regions PX. The deep device isolation pattern 150 may extend from a second surface 100b of the substrate 100 toward a first surface 100a of the substrate 100 and a bottom surface 150b of the deep device isolation pattern 150 may be located at a higher level than the first surface 100a of the substrate 100. Here, the term 'level' may mean a height from the first surface 100a of the substrate 100 toward the second surface 100b of the substrate 100.

A shallow device isolation pattern 103 may be disposed adjacent to the first surface 100a of the substrate 100. In some embodiments, the deep device isolation pattern 150 (i.e., the bottom surface 150b of the deep device isolation pattern 150) may be spaced apart from the shallow device isolation pattern 103.

The deep device isolation pattern 150 may include a semiconductor pattern 157 penetrating a portion of the substrate 100, and an isolation pattern IP disposed between the semiconductor pattern 157 and the substrate 100. The isolation pattern IP may be disposed between each of the pixel regions PX and a side surface of the semiconductor pattern 157 and may extend between a bottom surface of the semiconductor pattern 157 and the substrate 100. A bottom surface of the isolation pattern IP may correspond to the bottom surface 150b of the deep device isolation pattern 150. Top surfaces of the isolation pattern IP and the semiconductor pattern 157 may be substantially coplanar with the second surface 100b of the substrate 100.

The isolation pattern IP may include a first isolation pattern 151 adjacent to the second surface 100b of the substrate 100, and a second isolation pattern 153 adjacent to the first surface 100a of the substrate 100. The first isolation pattern 151 may penetrate a portion of the substrate 100. The first isolation pattern 151 may extend from the second surface 100b of the substrate 100 into the substrate 100. The first isolation pattern 151 may be disposed between each of the pixel regions PX and the side surface of the semiconductor pattern 157. A top surface of the first isolation pattern 151 may correspond to a top surface of the deep device isolation pattern 150 and may be substantially coplanar with the second surface 100b of the substrate 100. A bottom surface of the first isolation pattern 151 may be disposed in the substrate 100.

The second isolation pattern 153 may be disposed in the substrate 100. The second isolation pattern 153 may be spaced apart from the first surface 100a of the substrate 100. The second isolation pattern 153 may be disposed between each of the pixel regions PX and the side surface of the semiconductor pattern 157 and may extend between the bottom surface of the semiconductor pattern 157 and the substrate 100. A bottom surface of the second isolation pattern 153 may correspond to the bottom surface 150b of the deep device isolation pattern 150.

A first interface IF1 at which the first isolation pattern 151 is in contact with the second isolation pattern 153 may be spaced apart from the shallow device isolation pattern 103. The first isolation pattern 151 may be aligned with the second isolation pattern 153. More particularly, side surfaces of the first isolation pattern 151 may be aligned with or coplanar with corresponding side surfaces of the second isolation pattern 153, respectively. A height 151H of the first isolation pattern 151 may be greater than a height 153H of the second isolation pattern 153. Here, the term 'height' may mean a distance measured in a direction (e.g., the third direction D3) perpendicular to the first surface 100a of the substrate 100.

Except for the photoelectric conversion layer 10 described above, the interconnection layer 20 and the light transmitting layer 30 may be substantially the same as described with reference to FIGS. 1 to 4.

Figure 19:
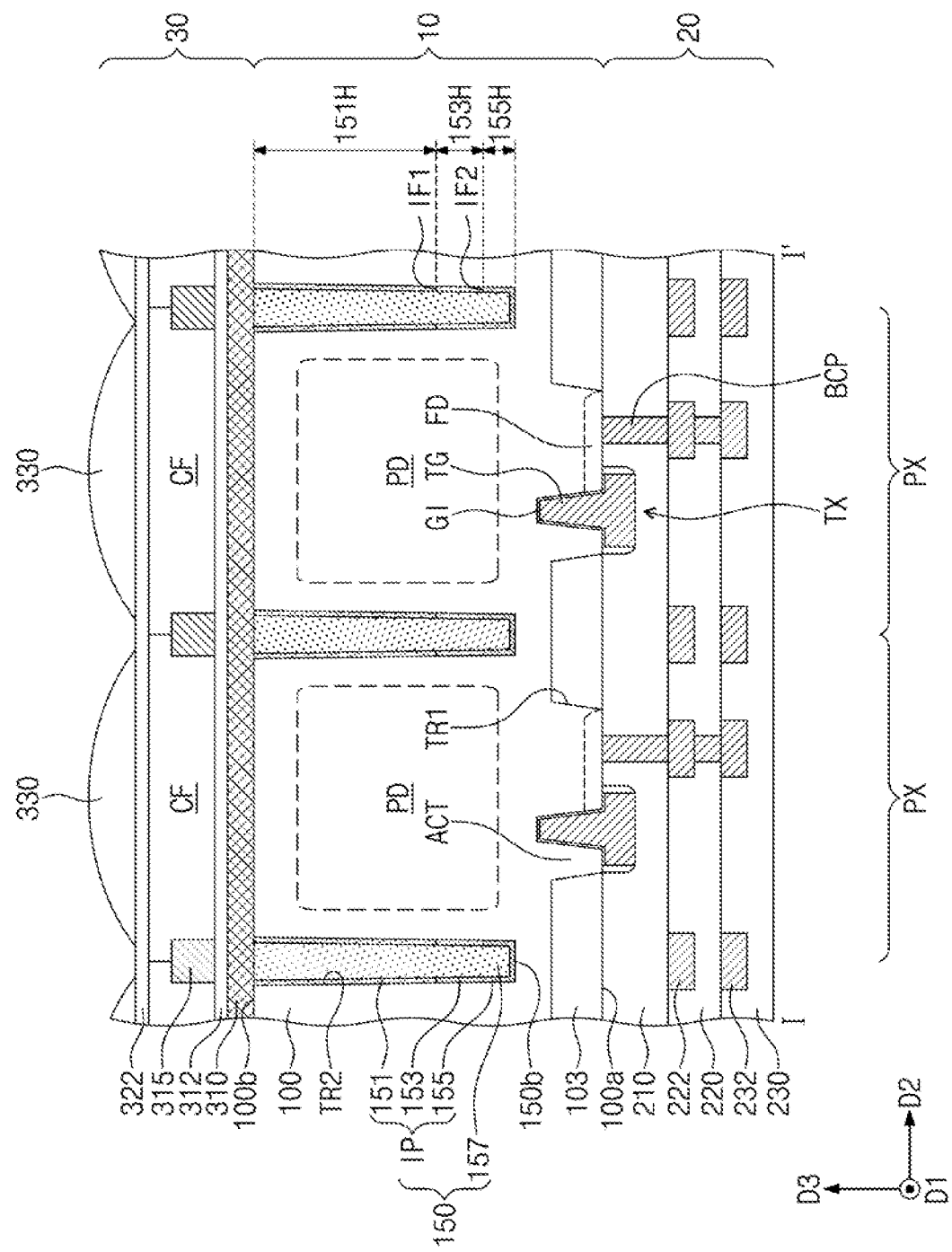
FIG. 19 is a cross-sectional view taken along the line I-I' of FIG. 3 to illustrate an image sensor according to an example embodiment.

FIG. 19 is a cross-sectional view taken along the line I-I' of FIG. 3 to illustrate an image sensor according to an example embodiment. Hereinafter, differences between the present embodiments and the above embodiments of FIGS. 1, 2, 3 and 6 will be mainly described for the purpose of ease and convenience in explanation.

Referring to FIG. 19 an image sensor according to an example embodiment may include a photoelectric conversion layer 10, an interconnection layer 20, and a light transmitting layer 30. The photoelectric conversion layer 10 may include a substrate 100 including pixel regions PX, and a deep device isolation pattern 150 disposed in the substrate 100 between the pixel regions PX. The deep device isolation pattern 150 may extend from a second surface 100b of the substrate 100 toward a first surface 100a of the substrate 100, and a bottom surface 150b of the deep device isolation pattern 150 may be located at a higher level than the first surface 100a of the substrate 100. Here, the term 'level' may mean a height from the first surface 100a of the substrate 100 toward the second surface 100b of the substrate 100.

A shallow device isolation pattern 103 may be disposed adjacent to the first surface 100a of the substrate 100. In some embodiments, the deep device isolation pattern 150

(i.e., the bottom surface 150b of the deep device isolation pattern 150) may be spaced apart from the shallow device isolation pattern 103.

The deep device isolation pattern 150 may include a semiconductor pattern 157 penetrating a portion of the substrate 100, and an isolation pattern IP disposed between the semiconductor pattern 157 and the substrate 100. The isolation pattern IP may be disposed between each of the pixel regions PX and a side surface of the semiconductor pattern 157 and may extend between a bottom surface of the semiconductor pattern 157 and the substrate 100. A bottom surface of the isolation pattern IP may correspond to the bottom surface 150b of the deep device isolation pattern 150. Top surfaces of the isolation pattern IP and the semiconductor pattern 157 may be substantially coplanar with the second surface 100b of the substrate 100.

The isolation pattern IP may include a first isolation pattern 151 adjacent to the second surface 100b of the substrate 100, a third isolation pattern 155 adjacent to the first surface 100a of the substrate 100, and a second isolation pattern 153 disposed between the first isolation pattern 151 and the third isolation pattern 155. The first isolation pattern 151 may penetrate a portion of the substrate 100. The first isolation pattern 151 may extend from the second surface 100b of the substrate 100 into the substrate 100. The first isolation pattern 151 may be disposed between each of the pixel regions PX and a side surface of the semiconductor pattern 157. A top surface of the first isolation pattern 151 may correspond to a top surface of the deep device isolation pattern 150 and may be substantially coplanar with the second surface 100b of the substrate 100. A bottom surface of the first isolation pattern 151 may be disposed in the substrate 100.

The second isolation pattern 153 may be disposed in the substrate 100. The second isolation pattern 153 may be disposed between each of the pixel regions PX and the side surface of the semiconductor pattern 157.

The third isolation pattern 155 may be disposed in the substrate 100. The third isolation pattern 155 may be spaced apart from the first surface 100a of the substrate 100. The third isolation pattern 155 may be disposed between each of the pixel regions PX and the side surface of the semiconductor pattern 157 and may extend between a bottom surface of the semiconductor pattern 157 and the substrate 100. A bottom surface of the third isolation pattern 155 may correspond to the bottom surface 150b of the deep device isolation pattern 150.

A second interface IF2 at which the second isolation pattern 153 is in contact with the third isolation pattern 155 may be spaced apart from the shallow device isolation pattern 103. The first isolation pattern 151 may be aligned with the second isolation pattern 153. More particularly, side surfaces of the first isolation pattern 151 may be aligned with or coplanar with corresponding side surfaces of the second isolation pattern 153, respectively. The second isolation pattern 153 may be aligned with the third isolation pattern 155. More particularly, the side surfaces of the second isolation pattern 153 may be aligned with or coplanar with corresponding side surfaces of the third isolation pattern 155, respectively. A height 151H of the first isolation pattern 151 may be greater than a total height (153H+155H) of the second isolation pattern 153 and the third isolation pattern 155. Here, the term 'height' may mean a distance measured in a direction (e.g., the third direction D3) perpendicular to the first surface 100a of the substrate 100.

Except for the photoelectric conversion layer 10 described above, the interconnection layer 20 and the light transmitting layer 30 may be substantially the same as described with reference to FIGS. 1 to 4.

Figure 20:
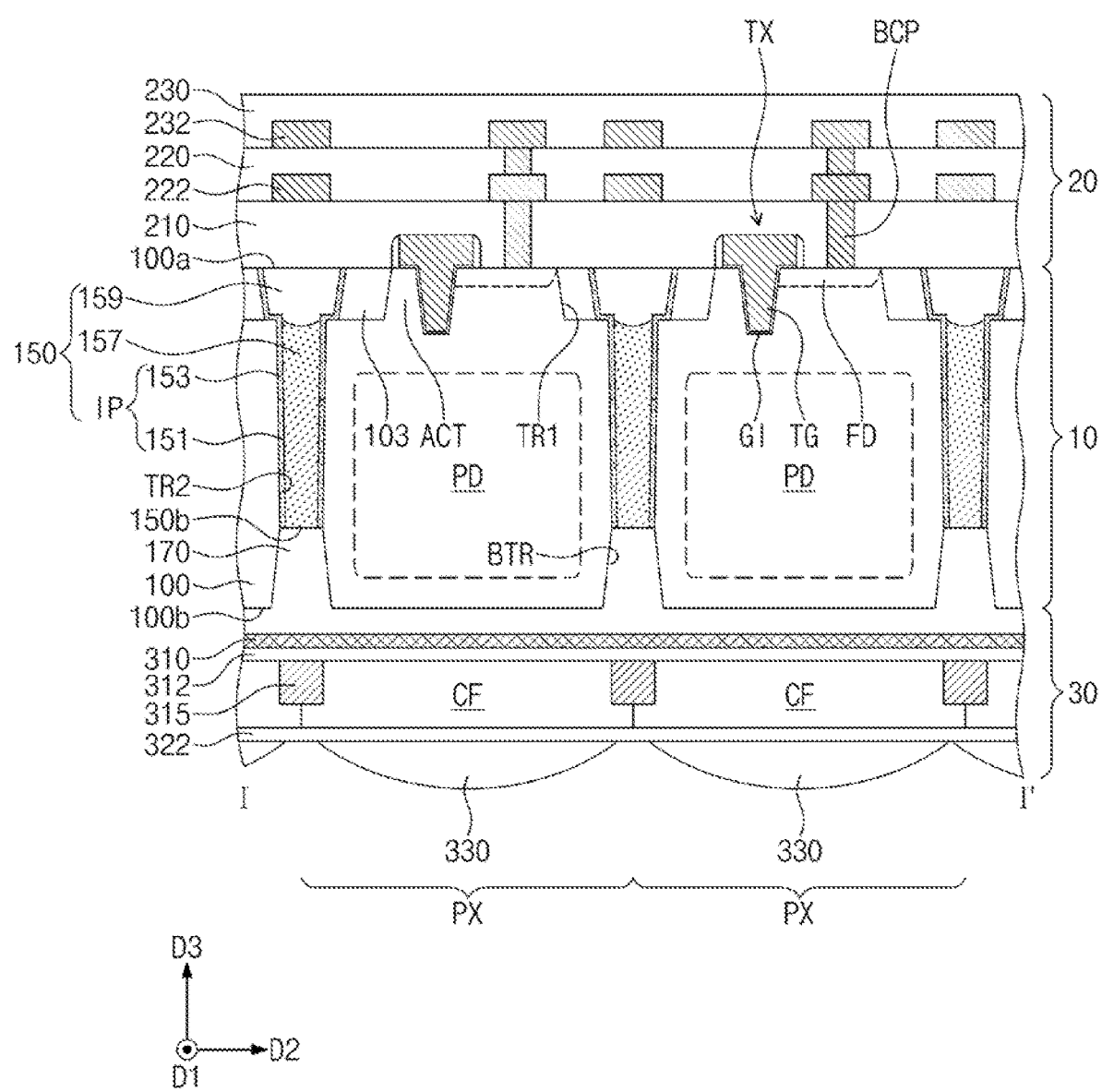
FIG. 20 is a cross-sectional view taken along the line I-I' of FIG. 3 to illustrate an image sensor according to an example embodiment.

FIG. 20 is a cross-sectional view taken along the line I-I' of FIG. 3 to illustrate an image sensor according to an example embodiment. Hereinafter, differences between the present embodiments and the above embodiments of FIGS. 1 to 4 will be mainly described for the purpose of ease and convenience in explanation.

Referring to FIG. 20, an image sensor according to an example embodiment may include a photoelectric conversion layer 10, an interconnection layer 20, and a light transmitting layer 30. The photoelectric conversion layer 10 may include a substrate 100 including pixel regions PX, and a deep device isolation pattern 150 disposed in the substrate 100 between the pixel regions PX. The deep device isolation pattern 150 may extend from a first surface 100a of the substrate 100 toward a second surface 100b of the substrate 100. A bottom surface 150b of the deep device isolation pattern 150 may be located at a higher level than the second surface 100b of the substrate 100. A shallow device isolation pattern 103 may be disposed adjacent to the first surface 100a of the substrate 100.

The photoelectric conversion layer 10 may further include a back isolation pattern 170. The back isolation pattern 170 may extend from the second surface 100b of the substrate 100 into the substrate 100. The back isolation pattern 170 may fill a back trench BTR recessed from the second surface 100b of the substrate 100. The back isolation pattern 170 may be provided between the pixel regions PX. The back isolation pattern 170 may have a lattice or grid structure surrounding each of the pixel regions PX when viewed in a plan view. In some embodiments, the back isolation pattern 170 may extend to cover the second surface 100b of the substrate 100. The deep device isolation pattern 150 may be in contact with the back isolation pattern 170. Thus, the deep device isolation pattern 150 and the back isolation pattern 170 may define the pixel regions PX. The back isolation pattern 170 may include at least one of, for example, a silicon-based insulating material or a metal oxide.

Except that the bottom surface 150b of the deep device isolation pattern 150 is spaced apart from the second surface 100b of the substrate 100 and is in contact with the back isolation pattern 170, other features of the deep device isolation pattern 150 may be substantially the same as described with reference to FIGS. 1 to 5.

Except for the photoelectric conversion layer 10 described above, the interconnection layer 20 and the light transmitting layer 30 may be substantially the same as described with reference to FIGS. 1 to 4.

Figure 21:
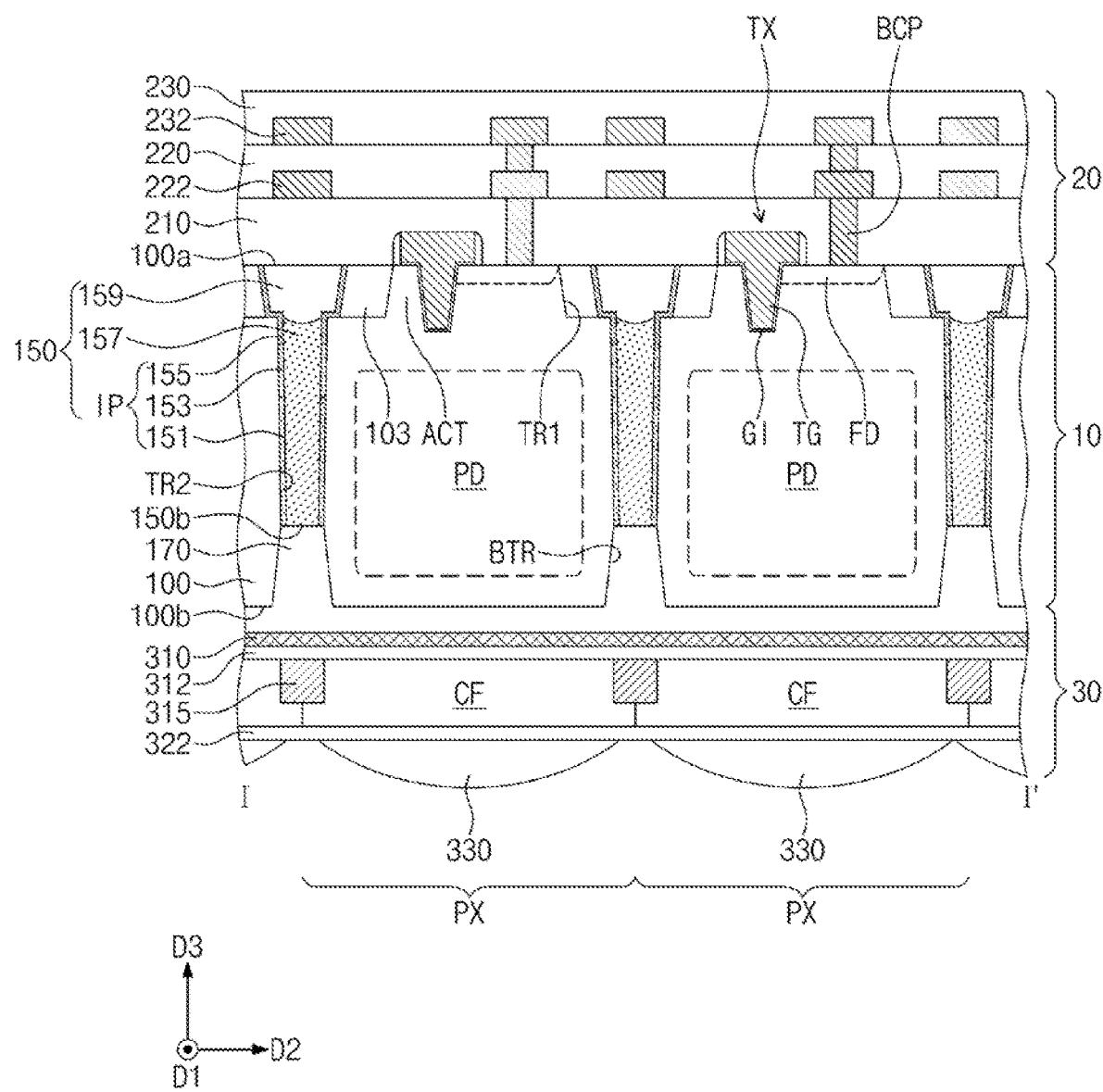
FIG. 21 is a cross-sectional view taken along the line I-I' of FIG. 3 to illustrate an image sensor according to an example embodiment.

FIG. 21 is a cross-sectional view taken along the line I-I' of FIG. 3 to illustrate an image sensor according to an example embodiment. Hereinafter, differences between the present embodiments and the above embodiments of FIGS. 1, 2, 3 and 6 will be mainly described for the purpose of ease and convenience in explanation.

Referring to FIG. 21, an image sensor according to an example embodiment may include a photoelectric conversion layer 10, an interconnection layer 20, and a light transmitting layer 30. The photoelectric conversion layer 10 may include a substrate 100 including pixel regions PX, and a deep device isolation pattern 150 disposed in the substrate 100 between the pixel regions PX. The deep device isolation pattern 150 may extend from a first surface 100a of the substrate 100 toward a second surface 100b of the substrate 100. A bottom surface 150b of the deep device isolation pattern 150 may be located at a higher level than the second surface 100b of the substrate 100. A shallow device isolation pattern 103 may be disposed adjacent to the first surface 100a of the substrate 100.

The photoelectric conversion layer 10 may further include a back isolation pattern 170. The back isolation pattern 170 may extend from the second surface 100b of the substrate 100 into the substrate 100. The back isolation pattern 170 may fill a back trench BTR recessed from the second surface 100b of the substrate 100. The back isolation pattern 170 may be provided between the pixel regions PX. The back isolation pattern 170 may have a lattice or grid structure surrounding each of the pixel regions PX when viewed in a plan view. In some embodiments, the back isolation pattern 170 may extend to cover the second surface 100b of the substrate 100. The deep device isolation pattern 150 may be in contact with the back isolation pattern 170. Thus, the deep device isolation pattern 150 and the back isolation pattern 170 may define the pixel regions PX. The back isolation pattern 170 may include at least one of, for example, a silicon-based insulating material or a metal oxide.

Except that the bottom surface 150b of the deep device isolation pattern 150 is spaced apart from the second surface 100b of the substrate 100 and is in contact with the back isolation pattern 170, other components and features of the deep device isolation pattern 150 may be substantially the same as described with reference to FIGS. 1, 2, 3 and 6.

Except for the photoelectric conversion layer 10 described above, the interconnection layer 20 and the light transmitting layer 30 may be substantially the same as described with reference to FIGS. 1 to 4.

Figure 22:
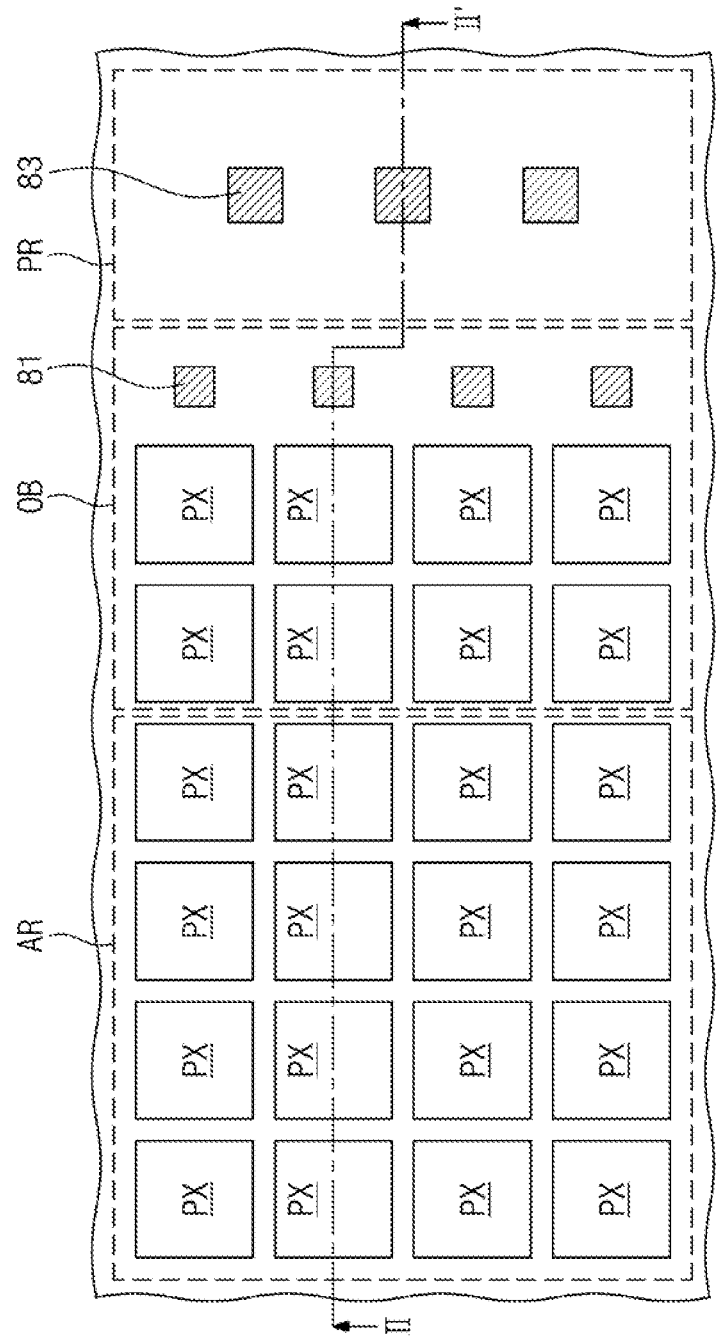
FIG. 22 is a plan view illustrating an image sensor according to an example embodiment.
Figure 23:
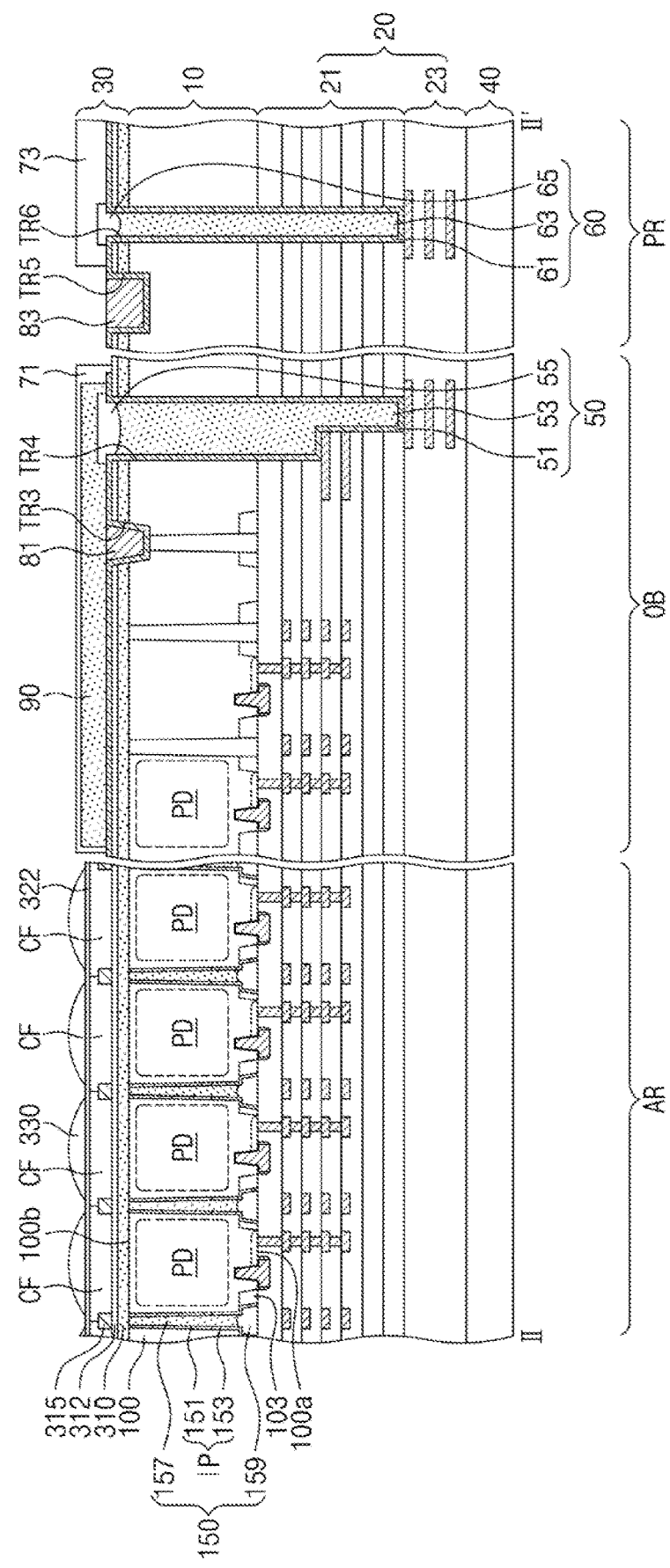
FIG. 23 is a cross-sectional view taken along a line II-II' of FIG. 22 to illustrate an image sensor according to an example embodiment.

FIG. 22 is a plan view illustrating an image sensor according to an example embodiment. FIG. 23 is a cross-sectional view taken along a line II-II' of FIG. 22 to illustrate an image sensor according to an example embodiment.

Referring to FIGS. 22 and 23, an image sensor may include a substrate 100 including a pixel array region AR, an optical black region OB and a pad region PR, an interconnection layer 20 on a first surface 100a of the substrate 100, a base substrate 40 on the interconnection layer 20, and a light transmitting layer 30 on a second surface 100b of the substrate 100. The interconnection layer 20 may be disposed between the first surface 100a of the substrate 100 and the base substrate 40. The interconnection layer 20 may include an upper interconnection layer 21 adjacent to the first surface 100a of the substrate 100, and a lower interconnection layer 23 between the upper interconnection layer 21 and the base substrate 40. The pixel array region AR may include a plurality of pixel regions PX, and a deep device isolation pattern 150 disposed between the pixel regions PX. The pixel array region AR may be substantially the same as the image sensor described with reference to FIGS. 1 to 5. For example, the deep device isolation pattern 150 may be substantially the same as the deep device isolation pattern 150 described with reference to FIGS. 1 to 5.

A first connection structure 50, a first contact 81 and a bulk color filter 90 may be disposed on the optical black region OB of the substrate 100. The first connection structure 50 may include a first light blocking pattern 51, a first separation pattern 53, and a first capping pattern 55. The first light blocking pattern 51 may be disposed on the second surface 100b of the substrate 100. The first light blocking pattern 51 may cover the first passivation layer 312 and may conformally cover an inner surface of each of a third trench TR3 and a fourth trench TR4. The first light blocking pattern 51 may penetrate the photoelectric conversion layer 10 and the upper interconnection layer 21. The first light blocking pattern 51 may be connected to the deep device isolation pattern 150 of the photoelectric conversion layer 10 and may be connected to interconnection lines provided in the upper and lower interconnection layers 21 and 23. Thus, the first connection structure 50 may electrically connect the photoelectric conversion layer 10 and the interconnection layer 20. The first light blocking pattern 51 may include a metal material (e.g., tungsten). The first light blocking pattern 51 may block light incident to the optical black region OB.

The first contact 81 may fill a remaining portion of the third trench TR3. The first contact 81 may include a metal material (e.g., aluminum). The first contact 81 may be connected to the deep device isolation pattern 150. The first separation pattern 53 may fill a remaining portion of the fourth trench TR4. The first separation pattern 53 may penetrate the photoelectric conversion layer 10 and may penetrate a portion of the interconnection layer 20. The first separation pattern 53 may include an insulating material. The first capping pattern 55 may be disposed on the first separation pattern 53.

The bulk color filter 90 may be disposed on the first connection structure 50 and the first contact 81. The bulk color filter 90 may cover the first connection structure 50 and the first contact 81. A first protective layer 71 may be disposed on the bulk color filter 90 to seal or encapsulate the bulk color filter 90.

A photoelectric conversion region PD may be provided in a corresponding pixel region PX of the optical black region OB. The photoelectric conversion region PD of the optical black region OB may be a region doped with dopants (e.g., N-type dopants) having the second conductivity type different from the first conductivity type of the substrate 100. The photoelectric conversion region PD of the optical black region OB may have a structure similar to that of the photoelectric conversion regions PD of the pixel array region AR but may not perform the same operation (i.e., the operation of generating an electrical signal using received light) as the photoelectric conversion regions PD of the pixel array region AR.

A second connection structure 60, a second contact 83 and a second protective layer 73 may be disposed on the pad region PR of the substrate 100. The second connection structure 60 may include a second light blocking pattern 61, a second separation pattern 63, and a second capping pattern 65.

The second light blocking pattern 61 may be disposed on the second surface 100b of the substrate 100. The second light blocking pattern 61 may cover the first passivation layer 312 and may conformally cover an inner surface of each of a fifth trench TR5 and a sixth trench TR6. The second light blocking pattern 61 may penetrate the photoelectric conversion layer 10 and the upper interconnection layer 21. The second light blocking pattern 61 may be connected to interconnection lines provided in the lower interconnection layer 23. Thus, the second connection structure 60 may electrically connect the photoelectric conversion layer 10 and the interconnection layer 20. The second light blocking pattern 61 may include a metal material (e.g., tungsten). The second light blocking pattern 61 may block light incident to the pad region PR.

The second contact 83 may fill a remaining portion of the fifth trench TR5. The second contact 83 may include a metal material (e.g., aluminum). The second contact 83 may function as an electrical connection path between the image sensor and an external device. The second separation pattern 63 may fill a remaining portion of the sixth trench TR6. The second separation pattern 63 may penetrate the photoelectric conversion layer 10 and may penetrate a portion of the interconnection layer 20. The second separation pattern 63 may include an insulating material. The second capping pattern 65 may be disposed on the second separation pattern 63. The second protective layer 73 may cover the second connection structure 60.

A current applied through the second contact 83 may flow into the deep device isolation pattern 150 through the second light blocking pattern 61, the interconnection lines of the interconnection layer 20 and the first light blocking pattern 51. Electrical signals generated from the photoelectric conversion regions PD in the pixel regions PX of the pixel array region AR may be transmitted to the outside through the interconnection lines of the interconnection layer 20, the second light blocking pattern 61 and the second contact 83.

According to an embodiment, the isolation pattern of the deep device isolation pattern may include at least two or more isolation patterns including different materials. More particularly, the first isolation pattern adjacent to one surface of the substrate to which light is incident may include the low refractive index (LRT) material, and the second isolation pattern adjacent to another surface of the substrate may include the high-k material. Thus, light incident to the first isolation pattern may be totally reflected to effectively prevent cross-talk between the pixel regions adjacent to each other and to minimize a loss of light sensitivity. In addition, noise may be minimized by the second isolation pattern, and thus a signal-to-noise ratio (SNR) may be improved.

While example embodiments have been particularly shown and described, it will be understood by one of ordinary skill in the art that variations in form and detail may be made therein without departing from the spirit and scope of the attached claims.

What is claimed is:

1. An image sensor comprising:
a substrate comprising a plurality of pixel regions, the substrate having a first surface, a second surface opposite the first surface, and a first trench recessed from the first surface;
a shallow device isolation pattern provided in the first trench; and
a deep device isolation pattern provided in the substrate between pixel regions of the plurality of pixel regions,
wherein the deep device isolation pattern comprises a semiconductor pattern penetrating at least a portion of the substrate, and an isolation pattern provided between the substrate and the semiconductor pattern,
wherein the isolation pattern comprises a first isolation pattern adjacent to the second surface of the substrate, and a second isolation pattern adjacent to the first surface of the substrate,
wherein a first interface at which the first isolation pattern contacts the second isolation pattern is spaced apart from the shallow device isolation pattern, and
wherein the first isolation pattern comprises a first material, and the second isolation pattern comprises a second material that is different from the first material.

2. The image sensor of claim 1, wherein the second isolation pattern comprises a lower portion disposed under the shallow device isolation pattern, and an upper portion penetrating the shallow device isolation pattern,
wherein a first side surface of the lower portion of the second isolation pattern is adjacent to the substrate, and a second side surface of the lower portion of the second isolation pattern is adjacent to the semiconductor pattern,
wherein a first side surface of the first isolation pattern is adjacent to the substrate, and a second side surface of the first isolation pattern is adjacent to the semiconductor pattern,
wherein the first side surface of the lower portion of the second isolation pattern is aligned with the first side surface of the first isolation pattern, and
wherein the second side surface of the lower portion of the second isolation pattern is aligned with the second side surface of the first isolation pattern.

3. The image sensor of claim 1, wherein the deep device isolation pattern further comprises an insulating pattern disposed on the semiconductor pattern and penetrating the shallow device isolation pattern, and
wherein the isolation pattern extends between the shallow device isolation pattern and the insulating pattern.

4. The image sensor of claim 1, wherein a bottom surface of the deep device isolation pattern is substantially coplanar with the second surface of the substrate.

5. The image sensor of claim 1, wherein a refractive index of the first isolation pattern is in a range from 1 to 2.

6. The image sensor of claim 1, wherein a dielectric constant of the second isolation pattern ranges is in a range from 4 to 25.

7. The image sensor of claim 1, wherein the isolation pattern further comprises a third isolation pattern provided on the second isolation pattern, and
wherein the third isolation pattern comprises a third material that is different from the second material of the second isolation pattern.

8. The image sensor of claim 7, wherein a second interface at which the second isolation pattern contacts the third isolation pattern is spaced apart from the shallow device isolation pattern.

9. The image sensor of claim 7, wherein the third isolation pattern comprises a lower portion disposed under the shallow device isolation pattern and an upper portion penetrating the shallow device isolation pattern,
wherein a first side surface of the lower portion of the third isolation pattern is adjacent to the substrate, and a second side surface of the lower portion of the third isolation pattern is adjacent to the semiconductor pattern,
wherein a first side surface of the second isolation pattern is adjacent to the substrate, and a second side surface of the second isolation pattern is adjacent to the semiconductor pattern,
wherein the first side surface of the lower portion of the third isolation pattern is aligned with the first side surface of the second isolation pattern, and
wherein the second side surface of the lower portion of the third isolation pattern is aligned with the second side surface of the second isolation pattern.

10. The image sensor of claim 7, wherein the first material of the first isolation pattern is a first insulating material,
wherein the second material of the second isolation pattern is a second insulating material, and
wherein the third material of the third isolation pattern is a third insulating material.

11. An image sensor comprising:
a substrate comprising a plurality of pixel regions, the substrate having a first surface, a second surface opposite the first surface, a first trench recessed from the first surface;
a shallow device isolation pattern provided in the first trench and extending to a first level, and a second trench extending from the first level of the first trench to the second surface of the substrate; and a deep device isolation pattern provided in the substrate between pixel regions of the plurality of pixel regions, wherein the deep device isolation pattern comprises a semiconductor pattern penetrating at least a portion of the substrate, and an isolation pattern provided between the substrate and the semiconductor pattern, wherein the isolation pattern comprises a first isolation pattern adjacent to the second surface of the substrate, and a second isolation pattern adjacent to the first surface of the substrate, wherein the second isolation pattern comprises a lower portion provided under the shallow device isolation pattern and in the second trench, and an upper portion penetrating the shallow device isolation pattern and provided in the first trench and the second trench, wherein the lower portion of the second isolation pattern is aligned with the first isolation pattern, and wherein the first isolation pattern comprises a first material, and the second isolation pattern comprises a second material that is different from the first material.

12. The image sensor of claim 11, wherein the first isolation pattern is spaced apart from the shallow device isolation pattern.

13. The image sensor of claim 11, wherein a refractive index of the first material of the first isolation pattern is in a range from 1 to 2, and wherein a dielectric constant of the second material of the second isolation pattern is in a range from 4 to 25.

14. The image sensor of claim 11, wherein the first material of the first isolation pattern comprises silicon oxide, and wherein the second material of the second isolation pattern comprises at least one of a nitride, a metal nitride, or a metal oxide.

15. The image sensor of claim 14, wherein the second material of the second isolation pattern comprises at least one of tungsten or hafnium.

16. The image sensor of claim 11, wherein a height of the first isolation pattern is greater than a height of the second isolation pattern.

17. The image sensor of claim 11, wherein a height of the first isolation pattern ranges is in a range from 60% to 95% of a total height of the isolation pattern.

18. An image sensor comprising:
a substrate comprising a plurality of pixel regions, the substrate having a first surface, a second surface opposite the first surface, a first trench recessed from the first surface and extending to a first level, and a second trench extending from the first level of the first trench to the second surface of the substrate;
a shallow device isolation pattern provided in the first trench;
a deep device isolation pattern provided between pixel regions of the plurality of pixel regions and disposed in the substrate;
a transistor provided on the first surface of the substrate;
micro lenses provided on the second surface of the substrate; and
color filters provided on the plurality of pixel regions and between the substrate and the micro lenses,
wherein the deep device isolation pattern comprises a semiconductor pattern penetrating at least a portion of the substrate, and an isolation pattern provided between the substrate and the semiconductor pattern,
wherein the isolation pattern comprises a first isolation pattern adjacent to the second surface of the substrate, and a second isolation pattern adjacent to the first surface of the substrate, the second isolation pattern extending from the first trench into the second trench, and
wherein the first isolation pattern comprises a first insulating material and the second isolation pattern comprises a second insulating material that is different from the first insulating material.

19. The image sensor of claim 18, wherein a height of the first isolation pattern is in a range from 3 times to 10 times a height of the second isolation pattern.

* * * * *